(12) United States Patent
Yamazaki et al.

(10) Patent No.: US 7,439,107 B2
(45) Date of Patent: Oct. 21, 2008

(54) LASER IRRADIATION APPARATUS, METHOD OF IRRADIATING LASER LIGHT, AND METHOD OF MANUFACTURING A SEMICONDUCTOR DEVICE

(75) Inventors: Shunpei Yamazaki, Tokyo (JP); Hidekazu Miyairi, Tochigi (JP); Akihisa Shimomura, Kanagawa (JP); Koichiro Tanaka, Atsugi (JP); Koji Dairiki, Tochigi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 258 days.

(21) Appl. No.: 10/744,138

(22) Filed: Dec. 24, 2003

(65) Prior Publication Data

US 2004/0248388 A1    Dec. 9, 2004

(30) Foreign Application Priority Data

Dec. 26, 2002    (JP)    ............................. 2002-378730

(51) Int. Cl.
*H01L 21/00* (2006.01)
*H01L 21/44* (2006.01)

(52) U.S. Cl. .................. 438/150; 438/149; 438/155; 438/166; 438/197; 257/E21.134; 257/E21.413; 257/E21.414; 257/E27.111; 257/E29.137

(58) Field of Classification Search .......... 257/E21.001, 257/E23.081, E29.293, E29.086, E21.134, 257/E21.413, E21.414, E27.111, E29.137; 438/795, 144, 798, 150, 149, 164, 166, 197; 359/614

See application file for complete search history.

(56) References Cited

U.S. PATENT DOCUMENTS 4,420,834 A    12/1983    Wiley, III et al.

(Continued)

FOREIGN PATENT DOCUMENTS

JP    07-027903    1/1995

(Continued)

*Primary Examiner*—Michael S Lebentritt
(74) *Attorney, Agent, or Firm*—Nixon Peabody LLP; Jeffrey L. Costellia

(57) ABSTRACT

When the laser light is irradiated with high output in the manufacturing process for a semiconductor device, an attenuator is heated and cause a deformation due to the laser light scattered in the attenuator. As a result, the attenuation ratio of the attenuator fluctuates, and it is difficult to process the substrate with the homogeneous irradiation energy. It is a problem of the present invention to provide a laser irradiation apparatus, a method of irradiating laser light and a method of manufacturing a semiconductor device, which can perform the laser irradiation effectively and homogeneously. In the present invention, the thermal energy generated in an attenuator is absorbed by means of cooling in order to keep the temperature of the attenuator constant. By cooling the attenuator so as to prevent the change of the attenuation ratio, the function of the attenuator is protected. In addition, the energy fluctuation of the laser light irradiated on the substrate is also prevented. The attenuator includes an attenuator which separates a damper portion physically and cools the damper (refer to FIG. 4), and also includes an attenuator which cools the whole attenuator (refer to FIG. 7).

32 Claims, 18 Drawing Sheets

U.S. PATENT DOCUMENTS

| | | | |
|---|---|---|---|
| 5,202,794 A | 4/1993 | Schnee et al. | |
| 5,329,350 A * | 7/1994 | Wright et al. | 356/218 |
| 5,854,803 A | 12/1998 | Yamazaki et al. | |
| 6,266,352 B1 * | 7/2001 | Eguchi et al. | 372/35 |
| 6,497,490 B1 | 12/2002 | Miller et al. | |
| 6,660,609 B2 * | 12/2003 | Tanaka et al. | 438/378 |
| 6,800,540 B1 * | 10/2004 | You | 438/486 |
| 6,911,358 B2 * | 6/2005 | Azami et al. | 438/150 |
| 6,974,731 B2 * | 12/2005 | Yamazaki et al. | 438/166 |
| 7,129,121 B2 * | 10/2006 | Azami et al. | 438/150 |
| 2002/0045288 A1 * | 4/2002 | Yamazaki et al. | 438/48 |
| 2002/0149837 A1 * | 10/2002 | Sekimura | 359/333 |
| 2002/0171912 A1 * | 11/2002 | Masuda | 359/326 |
| 2003/0161639 A1 * | 8/2003 | Brown et al. | 398/189 |
| 2003/0181043 A1 * | 9/2003 | Tanada et al. | 438/689 |
| 2003/0219056 A1 * | 11/2003 | Yager et al. | 372/57 |
| 2003/0228723 A1 * | 12/2003 | Yamazaki et al. | 438/164 |

FOREIGN PATENT DOCUMENTS

| | | |
|---|---|---|
| JP | 08-195357 | 7/1996 |
| JP | 2550370 | 8/1996 |

* cited by examiner (A)

(B)

(C)

(A)          (B)

(C)

(D)

LASER IRRADIATION APPARATUS, METHOD OF IRRADIATING LASER LIGHT, AND METHOD OF MANUFACTURING A SEMICONDUCTOR DEVICE

BACKGROUND OF THE INVENTION

1. Technical Field of the Invention

The present invention relates to a laser irradiation apparatus and a method of irradiating laser light for crystallizing, recrystallizing, or activating after ion implantation the semiconductor film and the like with laser light. In addition, the present invention relates to the laser irradiation apparatus and the method of irradiating laser light for irradiating a poly-crystalline or near poly-crystalline semiconductor film with the laser light so as to enhance its crystallinity. In addition, the present invention relates to a method of manufacturing a semiconductor device including the laser irradiation process. It is noted that the semiconductor device described here includes a general device that can be operated by utilizing the semiconductor characteristic. And thereby an electro-optical device such as a liquid crystal display device and a light-emitting device, and an electronic device having such an electro-optical device as its component are also included in the semiconductor device.

2. Description of the Related Art

In late years, a technique to form TFT over a substrate makes great progress, and application development to an active matrix semiconductor display device is advanced. In particular, TFT with the poly-crystalline semiconductor film is superior in field-effect mobility (what is called mobility) to TFT with a conventional amorphous semiconductor film and thereby high-speed operation becomes possible. Therefore, the technological development has been promoted for controlling a pixel by a driver circuit formed on the same substrate as the pixel, which was conventionally controlled by the driver circuit provided outside the substrate.

By the way, as for the substrate to be used in the semiconductor device, a glass substrate is expected rather than a single-crystal silicon substrate in terms of cost. The glass substrate is inferior in heat resistance, and is easy to be transformed due to the heat. Therefore, when a poly-silicon TFT is formed over the glass substrate, laser annealing is often employed for crystallizing the semiconductor film in order to prevent deformation of the glass substrate due to the heat.

The characteristics of laser annealing are that the processing time can be drastically shortened compared with annealing method using radiation heating or conduction heating, that the semiconductor substrate or the semiconductor film can be heated selectively and locally so that thermal damages are hardly given to the substrate and so on.

It is noted that the laser annealing method here indicates a technique to recrystallize an amorphous layer formed over the semiconductor substrate or the semiconductor film, and a technique to crystallize the amorphous semiconductor film formed over the substrate. In addition, a technique applied to planarize or modify the surface of the semiconductor substrate or the semiconductor film is also included.

In addition, in the laser annealing process, a pulsed laser beam having a high output such as excimer laser is shaped into a square spot having a side of several cm, or into linear having a length of 10 cm or more through an optical system, and then the irradiation position of the shaped beam spot is relatively scanned to the surface to be irradiated. Since such a method can enhance productivity and is superior industrially, it is employed preferably. (For example, Japanese published unexamined application H08-195357 is referred to).

In particular, when the linear beam spot is employed, unlike a punctate beam spot requiring to be scanned from front to back and from side to side, the linear beam spot can provide high productivity since the linear beam spot can be irradiated to the large-sized surface to be irradiated by scanning the linear beam spot only in a direction perpendicular to the direction of the major axis of the linear beam spot. It is noted that the linear beam spot here means a rectangular beam spot having a high aspect ratio. The reason why the beam is scanned in the direction perpendicular to the direction of the major axis of the linear beam spot is that it is the most effective scanning direction. Because of such high productivity, at present, the laser annealing process is mainly employing the linear beam spot obtained by shaping the beam spot output from a pulsed excimer laser through an appropriate optical system.

PROBLEM SOLVED BY THE INVENTION

In order to perform the laser annealing to the semiconductor film formed over the substrate effectively, the method to shape the beam spot output from the pulsed laser through the optical system and to scan the linear beam to the substrate is employed.

Here, a pulsed laser oscillating high output, typically the excimer laser and a YAG laser, has a property that the energy fluctuates in every pulse to some extent. Moreover, the pulsed laser has a characteristic that the degree of the energy fluctuation changes with the output energy. Particularly when the irradiation is performed in the energy region where the laser is hard to oscillate stably, it is difficult to irradiate all over the substrate with the laser light having the homogeneous energy.

Thus, the laser is operated in the energy region where output is the most stable. In that case, since the energy region where output is the most stable does not always correspond with the energy region that is necessary in the process, such a difference is usually compensated with an energy attenuator being able to change the transmittance. Thus, in order to perform the laser irradiation with the energy that is the most stable in output and the most appropriate in the process, it is preferable to adjust the energy of the laser light with the attenuator being able to change the transmittance.

An outline of the laser irradiation apparatus using the excimer laser and the attenuator is shown in FIG. 1. After the energy of the laser light oscillated from an excimer laser 101 is attenuated with an attenuator 102 so as to be a desired energy, the laser light is made into a desired shape (for example, a linear beam having a size of 30 cm×400 μm) through an optical system 103. The laser crystallization is performed with the laser light while scanning the substrate disposed in a process chamber 104.

A structure of the attenuator 102 is shown in FIG. 2. The laser light being incident into the attenuator transmits through an attenuation element 201 and a compensator 202. One side of the attenuation element 201 and opposite sides of the compensator 202 are coated in order to prevent the reflection. A rotating stage 203 can adjust an attenuation ratio, while a rotating stage 204 can adjust an emergence angle of the laser light. The other side of the attenuation element 201 is coated so that the transmittance changes in accordance with the incidence angle of the light. In other words, since the transmittance of the laser light changes with the incidence angle to the attenuation element 201, the attenuation ratio of the laser light can be controlled by rotating the rotating stage 203 in the attenuator. In addition, because the attenuation element 201 hardly absorbs the laser light, the total of the reflected light and the transmitted light of the laser light in the attenuation element 201 is almost 100%. Therefore, when an angle of the attenuation element 201 is changed in order to change the transmittance, an optical path of the reflected light having comparatively high intensity also changes greatly. In addition, the attenuation element 201 has the transmittance changed in accordance with the change of the incidence angle, and the optical path of the reflected light also changes along with it. Therefore, the compensator 202 is employed to suppress such the change. The principle is extremely simple. The optical path is compensated by operating the compensator 202 symmetrically in accordance with the angle of the attenuation element 201. In addition, the laser light reflected inside the attenuator is scattered with a damper 205 set in a chamber 206.

It is understood that the substrate can be processed with the appropriate energy when the laser light is irradiated after the energy of the laser light is attenuated with the above method. In late years, however, the power of the laser has been increasing remarkably, and thereby the attenuator having the conventional structure is heated so that it does not work any longer. This is because a part of the reflected light from the attenuation element is absorbed in the attenuator as thermal energy.

When the laser having high output is used, the temperature of the chamber 206 increases so that the attenuator body or the parts fixing the attenuation element are deformed. For this reason, the angle of the attenuation element changes, and thereby the energy of the laser light transmitting through the attenuator also fluctuates. An example of temperature fluctuation and transmittance fluctuation of the attenuator is shown in FIG. 3. Since the temperature of the chamber 206 increases as the time goes on, when the beam is used as it is for the laser crystallization, the energy distribution of the laser light irradiated to the substrate is not homogeneous. Therefore, the whole surface of the substrate cannot be irradiated homogeneously. In addition, when a plurality of semiconductor films are processed, the characteristic cannot be kept constant in all the semiconductor films.

When the laser irradiation is performed to the semiconductor film, it is necessary to process the semiconductor film homogeneously by irradiating the laser light homogeneously. Therefore, the attenuator being able to keep the energy of the laser light with the constant attenuation ratio was necessary as means for preventing the energy fluctuation of the transmitted light due to the temperature fluctuation of the attenuator and to make the irradiation energy of the laser light on the substrate constant at an appropriate value.

In view of such problems, it is an object of the present invention to provide a laser irradiation apparatus, a method of irradiating laser light and a method of manufacturing a semiconductor device, which can perform the laser irradiation effectively and homogeneously.

SUMMARY OF THE INVENTION

The present invention provides the laser irradiation apparatus which can irradiate laser light while preventing the energy fluctuation due to the temperature fluctuation of the laser light attenuator and while suppressing the energy fluctuation given to the substrate (object to be irradiated). In addition, the present invention provides a method of irradiating laser light using the apparatus, and a method of manufacturing a semiconductor device including the method of irradiating laser light.

In the attenuator, the laser light reflected by the attenuation element is scattered with the damper, and is absorbed in the attenuator as the thermal energy. Thus, in the present invention, in order to keep the temperature of the attenuator constant, the generated thermal energy is absorbed by cooling. It is possible to prevent the energy fluctuation of the laser light irradiated to the substrate in addition to protect the function of the attenuator by cooling the attenuator so as to prevent the change of the attenuation ratio.

The above structure makes it possible to irradiate the laser light with the most appropriate energy for processing the semiconductor film on the substrate and to crystallize the whole surface of the semiconductor film on the substrate homogeneously. The present inventions are enumerated hereinafter.

A configuration of a laser irradiation apparatus disclosed in the present invention is characterized that the laser irradiation apparatus comprises a laser oscillator, an attenuator for attenuating laser light output from the laser oscillator, means for cooling the whole attenuator, and an optical system for shaping the laser light output from the laser oscillator into linear on the surface to be irradiated.

Other configuration of a laser irradiation apparatus disclosed in the present invention is characterized that the laser irradiation apparatus comprises a laser oscillator, an attenuator for attenuating laser light output from the laser oscillator, means for water-cooling the whole attenuator, and an optical system for shaping the laser light output from the laser oscillator into linear on a surface to be irradiated.

Other configuration of a laser irradiation apparatus disclosed in the present invention is characterized that the laser irradiation apparatus comprises a laser oscillator, an attenuator for attenuating the laser light output from the laser oscillator, means for cooling a damper separated from the attenuator physically, and an optical system for shaping the laser light output from the laser oscillator into linear on a surface to be irradiated.

Other configuration of a laser irradiation apparatus disclosed in the present invention is characterized that the laser irradiation apparatus comprises a laser oscillator, an attenuator for attenuating the laser light output from the laser oscillator, means for cooling the attenuator and a damper separated from the attenuator physically, and an optical system for shaping the laser light output from the laser oscillator into linear on a surface to be irradiated.

Other configuration of a laser irradiation apparatus disclosed in the present invention is characterized that the laser irradiation apparatus comprises a laser oscillator, an attenuator for attenuating the laser light output from the laser oscillator, means for water-cooling a damper separated from the attenuator physically, and an optical system for shaping the laser light output from the laser oscillator into linear on a surface to be irradiated.

Other configuration of a laser irradiation apparatus disclosed in the present invention is characterized that the laser irradiation apparatus comprises a laser oscillator, an attenuator for attenuating the laser light output from the laser oscillator, means for water-cooling a damper separated from the attenuator physically, and an optical system for shaping the laser light output from the laser oscillator into linear on a surface to be irradiated.

Other configuration of a laser irradiation apparatus disclosed in the present invention is characterized that the laser irradiation apparatus comprises a laser oscillator, an attenuator for attenuating the laser light output from the laser oscillator, means for air-cooling the attenuator and water-cooling a damper separated from the attenuator physically, and an optical system for shaping the laser light output from the laser oscillator into linear on a surface to be irradiated.

In the configurations of the above-mentioned invention, the laser oscillator is characterized in that any one of an excimer laser, a YAG laser, a glass laser, a YVO$_4$ laser, a YLF laser, and an Ar laser is employed.

A configuration of a method of irradiating laser light disclosed in the present invention is characterized in that the method of irradiating laser light is performed by attenuating laser light output from a laser oscillator with an attenuator, keeping irradiation energy constant by cooling the whole attenuator, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by water-cooling the whole attenuator, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by introducing the laser light thrown aside by the attenuator into a damper separated physically from the attenuator and by cooling the damper, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by introducing the laser light thrown aside by the attenuator into a damper separated physically from the attenuator and by cooling the attenuator and the damper, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by introducing the laser light thrown aside by the attenuator into a damper separated physically from the attenuator and by water-cooling the damper, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by introducing the laser light thrown aside by the attenuator into a damper separated physically from the attenuator and by water-cooling the attenuator and the damper, shaping the beam spot of the laser light output from the laser oscillator into linear on a surface to be irradiated, and irradiating the laser light.

Other configuration of a method of irradiating laser light disclosed in the present invention is characterized in that the method of irradiating laser light is performed by attenuating laser light output from a laser oscillator with an attenuator, keeping irradiation energy constant by introducing the laser light thrown aside by the attenuator into a damper separated physically from the attenuator and by air-cooling the attenuator and water-cooling the damper, shaping the beam spot of the laser light output from the laser oscillator into linear on a surface to be irradiated, and irradiating the laser light.

In the configurations of the above-mentioned invention, the laser oscillator is characterized in that any one of an excimer laser, a YAG laser, a glass laser, a YVO$_4$ laser, a YLF laser, and an Ar laser is employed.

In addition, a configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by generating the laser light while cooling the attenuation means, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear while irradiating the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by generating the laser light while water-cooling the attenuation means, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear beam while irradiating the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by introducing the laser light thrown aside by the attenuator into a damper separated physically from the attenuator and by generating the laser light while cooling the damper, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear beam while irradiating the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by introducing the laser light thrown aside by the attenuator into a damper separated physically from the attenuator and by generating the laser light while cooling the attenuation means and the damper, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning the scanning stage in a direction of a minor axis of the linear beam while emitting the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating laser light with attenuation means for attenuating the laser light, keeping an attenuation ratio constant by introducing the laser light thrown aside by the attenuator into a damper separated physically from the attenuator and by generating the laser light while water-cooling the damper, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear beam while irradiating the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by introducing the laser light thrown aside by the attenuator into a damper separated physically from the attenuator and by generating the laser light while water-cooling the attenuation means and the damper, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear beam while irradiating the laser light.

Other configuration of a method of manufacturing a semiconductor device disclosed in the present invention is characterized in that a process in the method of manufacturing a semiconductor device is performed by forming a non-single crystal semiconductor film over a substrate, generating laser light, attenuating the laser light with attenuation means for attenuating laser light, keeping an attenuation ratio constant by introducing the laser light thrown aside by the attenuator into a damper separated physically from the attenuator and by generating the laser light while air-cooling the attenuation means and water-cooling the damper, shaping the laser light into a linear beam spot on a surface to be irradiated, making a surface of the non-single crystal semiconductor film match with the surface to be irradiated by setting the substrate with the non-single crystal semiconductor film formed thereon on a scanning stage, and performing the laser annealing to the non-single crystal semiconductor film by scanning relatively the scanning stage in a direction of a minor axis of the linear beam while irradiating the laser light.

In the configurations of the above-mentioned invention, the laser oscillator is characterized in that any one of an excimer laser, a YAG laser, a glass laser, a YVO$_4$ laser, a YLF laser, and an Ar laser is employed.

DETAILED DESCRIPTION OF THE PREFERRED EMBODIMENTS

Hereinafter, a configuration of laser irradiation apparatus of the present invention is explained.

The laser irradiation apparatus of the present invention comprises a laser oscillator, an attenuator including a cooler, and an optical system. The laser oscillator operates in the energy region where the oscillation is stable. The attenuator can attenuate the energy in the energy range appropriate for the laser irradiation. In addition, the present apparatus has the optical system for shaping the laser light output from the laser oscillator. The laser light shaped into linear through the optical system is irradiated to a processing object on the substrate. The whole surface of the substrate can be irradiated with the laser light by scanning the substrate with the movable stage.

Figure 1:
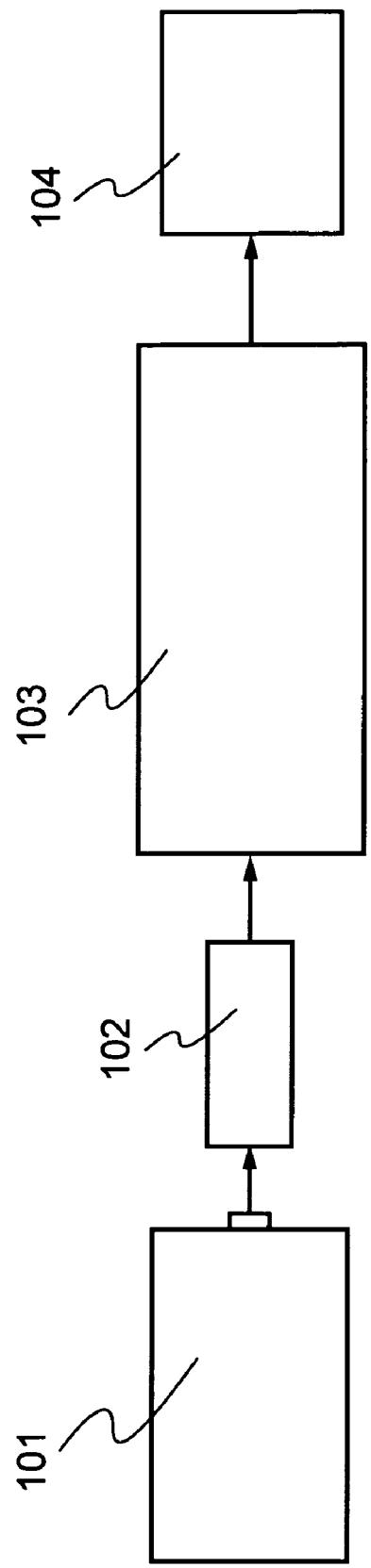
FIG. 1 shows an outline of a laser irradiation apparatus of the present invention.
Figure 2:
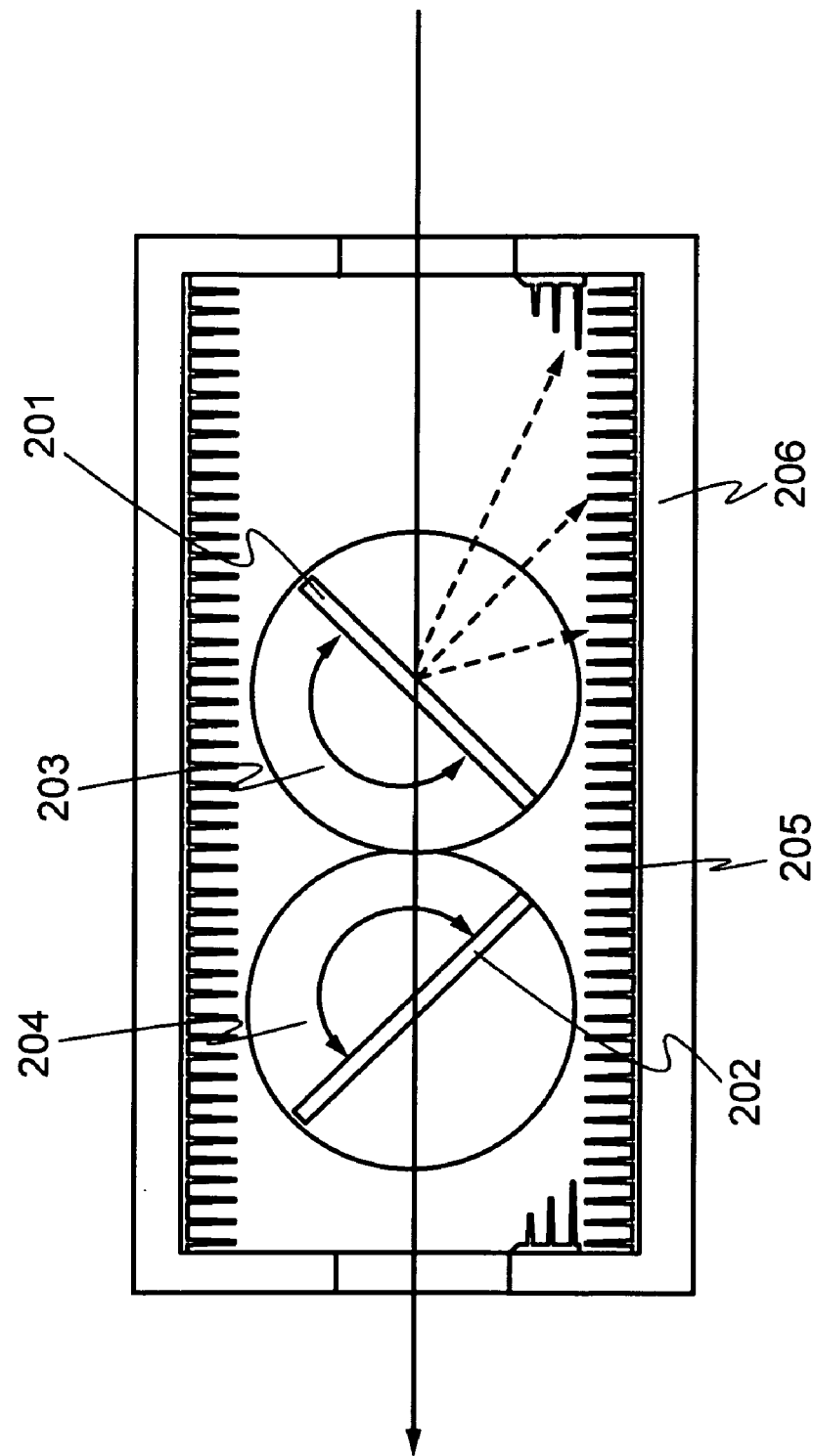
FIG. 2 shows an example of an attenuator.
Figure 3:
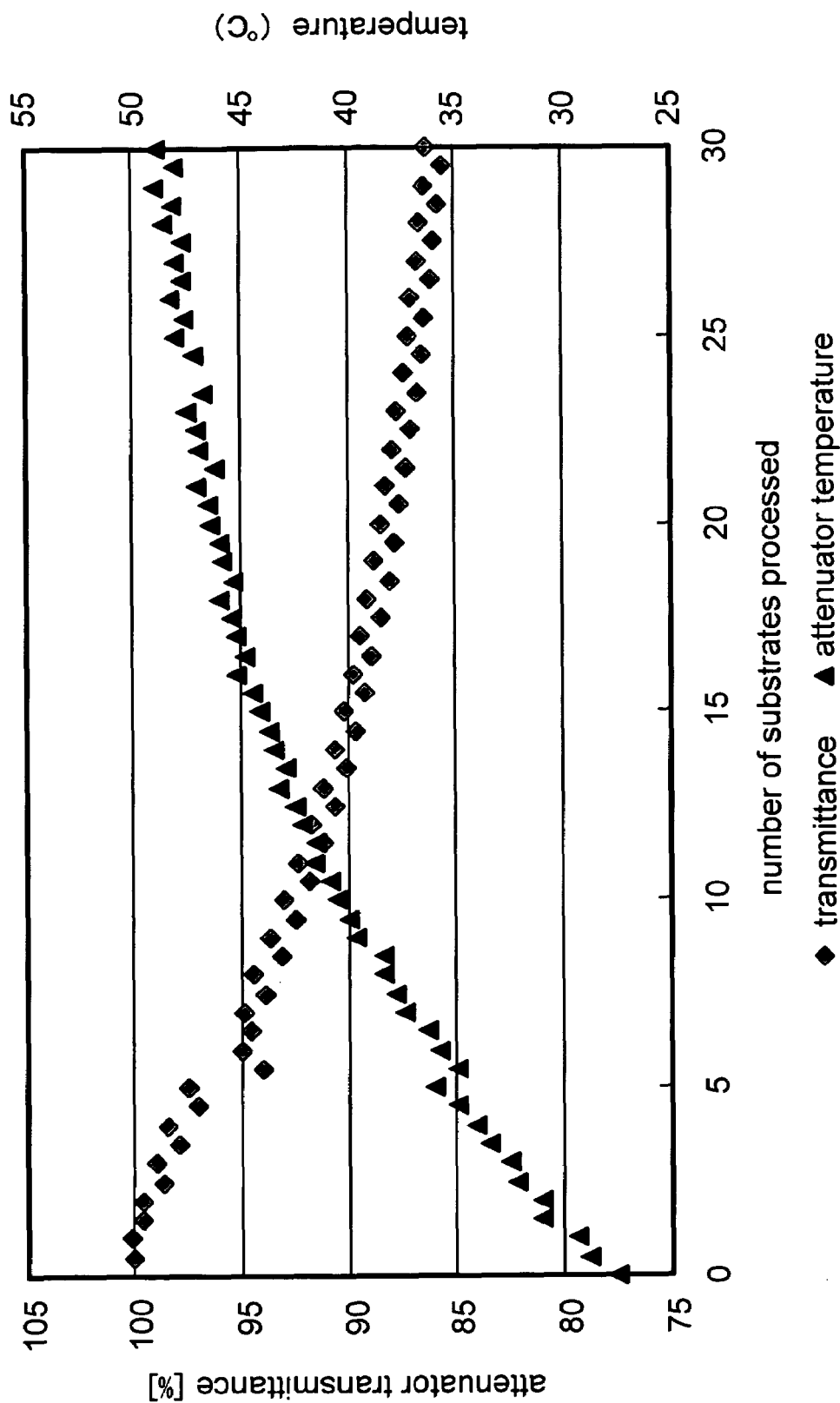
FIG. 3 shows a temperature and a transmittance of an attenuator to the number of processing substrates.
Figure 4:
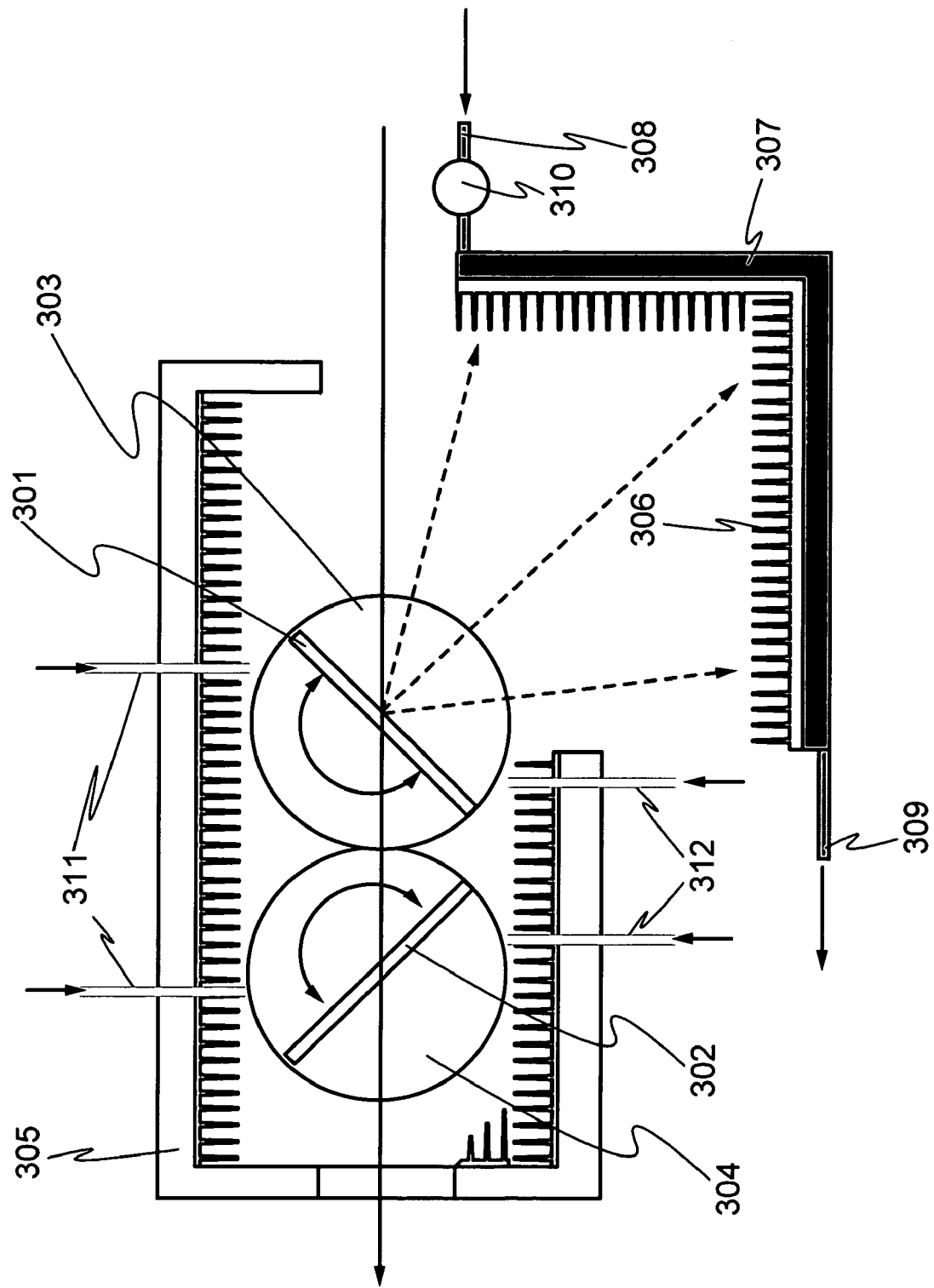
FIG. 4 shows an example of an attenuator disclosed in the present invention.

The attenuator in the laser apparatus in the present invention can suppress the temperature change of the attenuator and keep an attenuation ratio of the laser light constant. A configuration of the attenuator is shown in FIG. 4. The laser light being incident into the attenuator transmits through an attenuation element 301 and a compensator 302. One side of the attenuation element 301 and opposite sides of the compensator 302 are coated in order to prevent the reflection. The rotating stage 303 can adjust an attenuation ratio, while the rotating stage 304 can adjust an emergent angle of the laser light. The other side of the attenuation element 301 is coated so that the transmittance changes in accordance with an incidence angle of the light. In other words, since the transmittance of the laser light fluctuates with the incidence angle to the attenuation element 301, the attenuation ratio of the laser light can be controlled by rotating the rotating stage 303 in the attenuator. It is noted that because the attenuation element 301 hardly absorbs the laser light, the total of the reflected light and the transmitted light of the laser light in the attenuation element 301 is almost 100%. Therefore, when angle of the attenuation element 301 is changed in order to change the transmittance, an optical path of reflected light having comparatively high intensity also changes greatly. The attenuation element 301 has the transmittance changed in accordance with the change of the incidence angle, and the optical path of the transmitted light also changes along with it. Therefore, the compensator 302 is employed to prevent such the change. The principle is extremely simple. The optical path is compensated by operating the compensator 302 symmetrically in accordance with the angle of the attenuation element 301.

Since the surface of the compensator 302 is coated in order to prevent the reflection in the present apparatus, the reflection in the compensator 302 is not taken into account. Thus, only the laser light reflected on a plane of incidence of the attenuation element 301 may be regarded to contribute to the increasing of the temperature of the attenuator. Thus, only the region where a beam reflected from the plane of incidence of the attenuation element 301 arrives is separated from a chamber 305 of the attenuator, and a damper 306 is water-cooled. A water meter 310 adjusts the amount of water injected into a cooler 307 from a pipe 308 and the cooling water passed through the cooler is drained away from a pipe 309. The laser light reflected on the plane of incidence of the attenuation element 301 is scattered with the damper 306 and thermal energy is generated. In the present apparatus, it is possible to absorb the generated thermal energy in the cooler 307 and to keep the temperature of the attenuator constant. As a result, it becomes possible to suppress the deformation of the attenuator body or the parts fixing the attenuation element in the attenuator due to the temperature fluctuation of the attenuator, and to prevent the energy fluctuation of the transmitted light due to the deformation thereof. In addition, the irradiation energy of the laser light on the surface to be irradiated can be made constant at an appropriate value. It is noted that FIG. 4 shows an example in which the attenuator is water-cooled but the apparatus of the present invention is not limited to this configuration. The apparatus of the present invention may have a configuration in which the attenuator is cooled with the cooling element such as peltiert element.

In addition, the apparatus may have a configuration in which opposite sides of the attenuation element 301 and the compensator 302 are sprayed with the gas such as nitrogen from a pipe 311 and a pipe 312 in order to prevent the fluctuation of the attenuation ratio of the attenuator due to the dust adhesion to the attenuation element 301 and the compensator 302. In addition, the apparatus may have a configuration in which the attenuator is air-cooled and the dust is eliminated while cooling the attenuation element 301 and the compensator 302.

Hereinafter, the case in which the semiconductor film is processed with the laser irradiation apparatus of the present invention is explained. At first, a glass substrate (for example, AN100) having a size of 600×720×0.7 mm is prepared as the substrate. This substrate has a enough resistance against the temperature up to 600°. A silicon oxide film is formed in 200 nm thick over the glass substrate as a base film. In addition, an amorphous silicon film is formed in 55 nm thick thereon. These films are formed with the sputtering. Alternatively they may be formed with the plasma-CVD.

The substrate with these films formed thereon is arranged in the atmosphere of nitrogen at a temperature of 450° for an hour. This process is to decrease the concentration of hydrogen in the amorphous silicon film. This process is performed since the film cannot resist against the laser energy when the film contains too much hydrogen. The concentration of hydrogen in the film is appropriate on the order of $10^{20}$ atoms/cm$^3$. Here, $10^{20}$ atoms/cm$^3$ means that $10^{20}$ hydrogen atoms exist in 1 cm.

In this embodiment mode, a XeCl excimer laser is used as a laser oscillator. The XeCl excimer laser is a pulsed laser, and emits a wavelength of 308 nm.

Laser light output from the laser oscillator is adjusted in the desired energy range by the above attenuator and is incident into an optical system. The beam of the laser light just before being incident into the optical system has a size approximately of 3×2 cm and is rectangular in shape. The optical system shapes the laser light into the elongated beam (linear beam) having a length approximately from 8 to 30 cm, and having a width approximately from 200 to 1000 μm.

Figure 5:
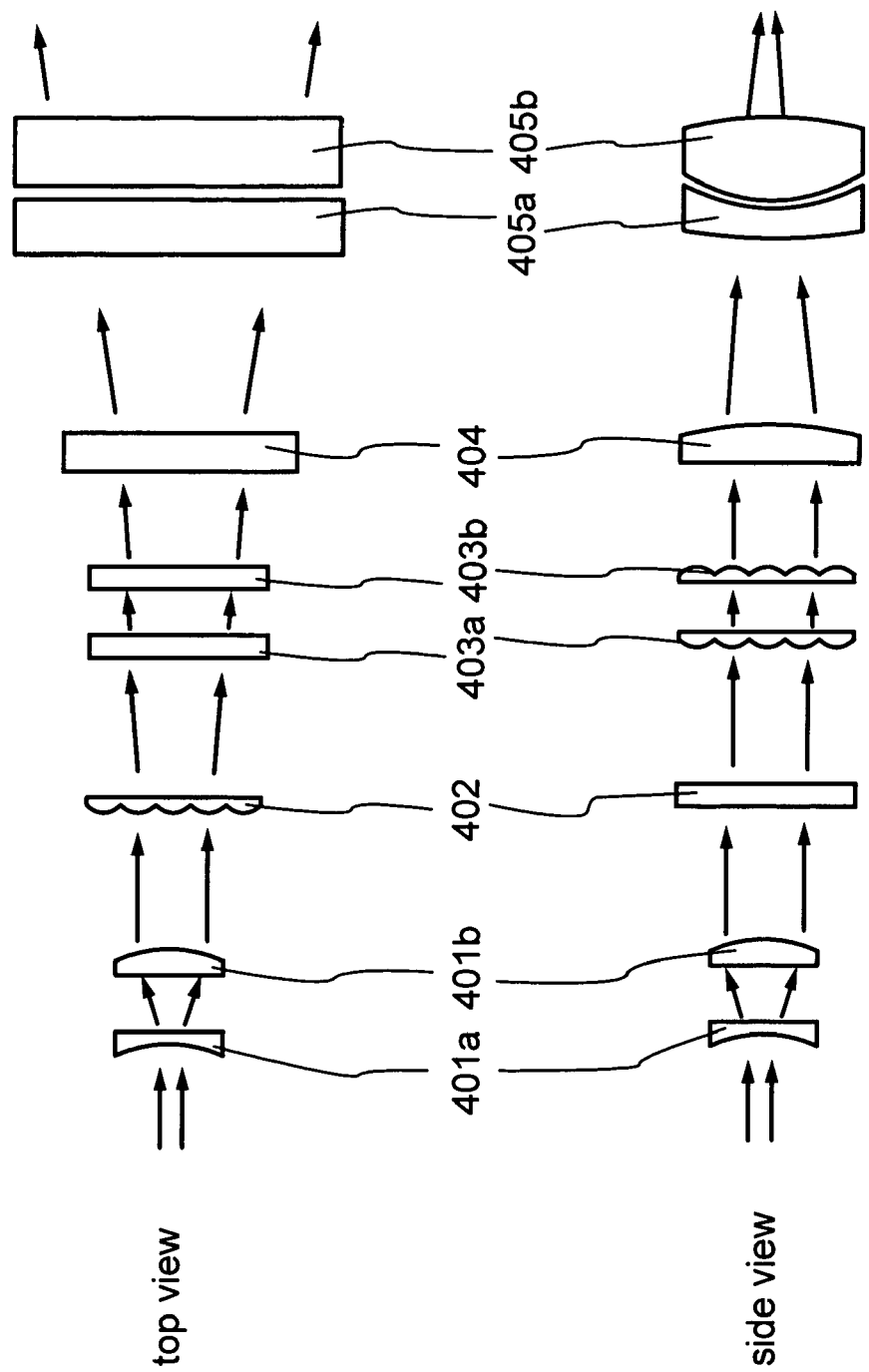
FIG. 5 shows an optical system.

The optical system in the present apparatus is explained here. An example of the optical system is shown in FIG. 5. The laser light being incident into the optical system is propagated to the direction indicated by arrows in FIG. 5. First, the laser light is expanded by spherical lenses 401a and 401b. Next, the laser light having Gaussian distribution is changed into the laser light having rectangular distribution by passing through cylindrical lens arrays 402, 403a, and 403b. The linear beam can be focused on the processing object by having the shaped laser beam transmit through a cylindrical lens 404 and a doublet cylindrical lens 405a and 405b.

The laser light shaped through the optical system is irradiated by scanning the stage with the processing object mounted thereon in the direction of the minor axis of the linear beam, for example. On this occasion, a practitioner may decide the energy density of the beam spot on the surface to be irradiated and the scanning speed appropriately.

In this way, the laser annealing process is completed. A lot of substrates can be processed by repeating the above processes. For example, an active matrix liquid crystal display can be manufactured with the substrate. A practitioner may manufacture the display according to the known method.

In the above-mentioned example, the amorphous silicon film was used as the non-single crystal semiconductor film, but it is easily supposed that the present invention can be applied to the other non-single crystal semiconductor. For example, as the non-single crystal semiconductor film, a compound semiconductor film having an amorphous structure such as an amorphous silicon germanium film may be employed. A poly-crystalline silicon film may be used for the non-single crystal semiconductor film alternatively.

Next, an example of a laser irradiation apparatus with the use of an attenuator, which is different from the attenuator described in the above embodiment mode, is given.

Figure 6:
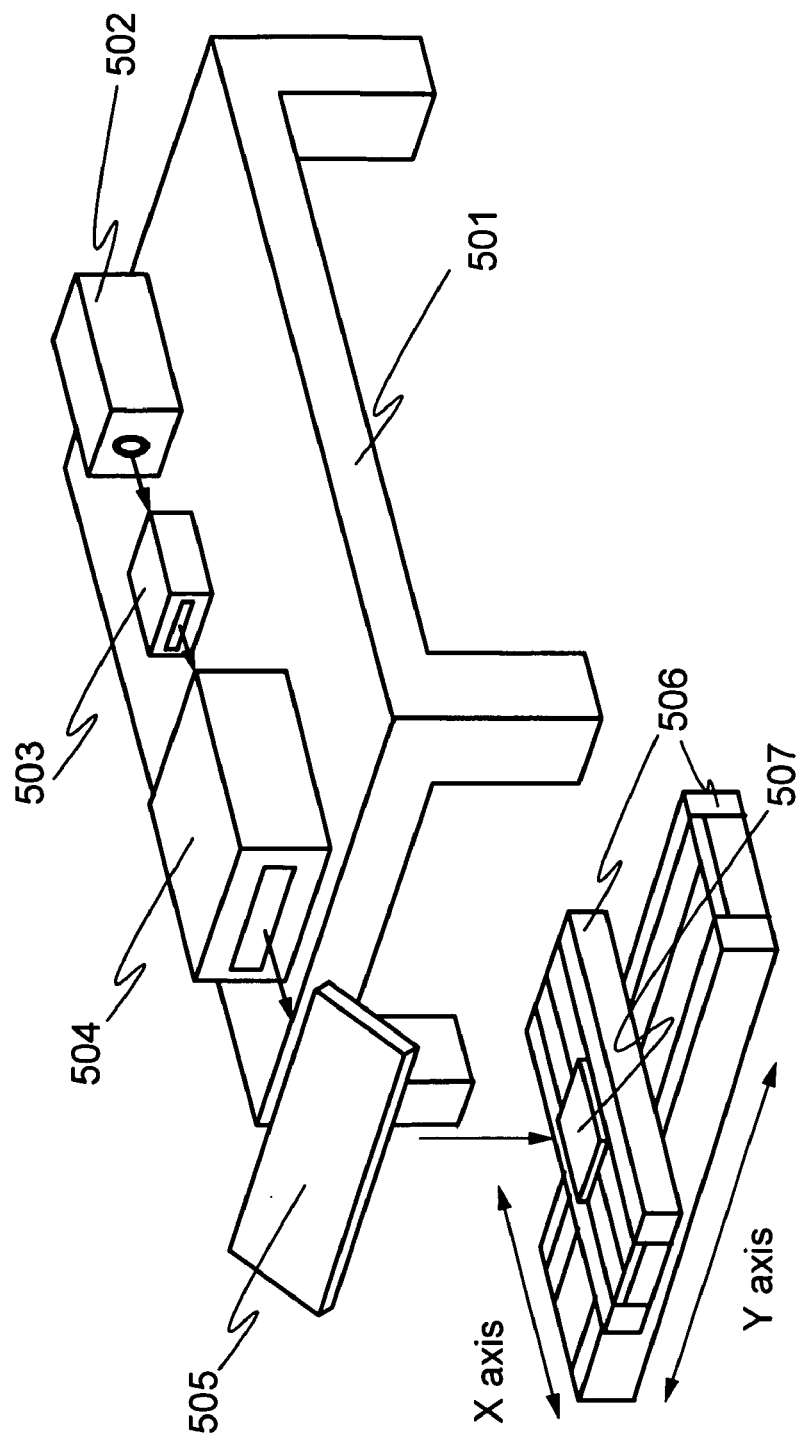
FIG. 6 shows the structure of a laser irradiation apparatus in the present invention.

A conception diagram of a laser irradiation apparatus is shown in FIG. 6. A reference numeral 501 is a main body of the laser irradiation apparatus. Laser light is oscillated with an oscillator 502. The laser light oscillated with the oscillator 502 is excimer laser. Of course, the laser can be changed according to the purpose of its process appropriately. Moreover, the other excimer laser or a laser having another oscillation system can be also used.

The oscillator 502 is operated in the energy region where output is the most stable. In that case, because the energy region does not always correspond with the range of the energy region required in the process, such a difference is compensated with the attenuator 503 being able to change the transmittance. Thus, in order to irradiate the laser light having the output with the most stable energy and the most appropriate energy for the process, it is preferable to adjust the energy of the laser light with the attenuator 503 being able to change the transmittance.

Figure 7:
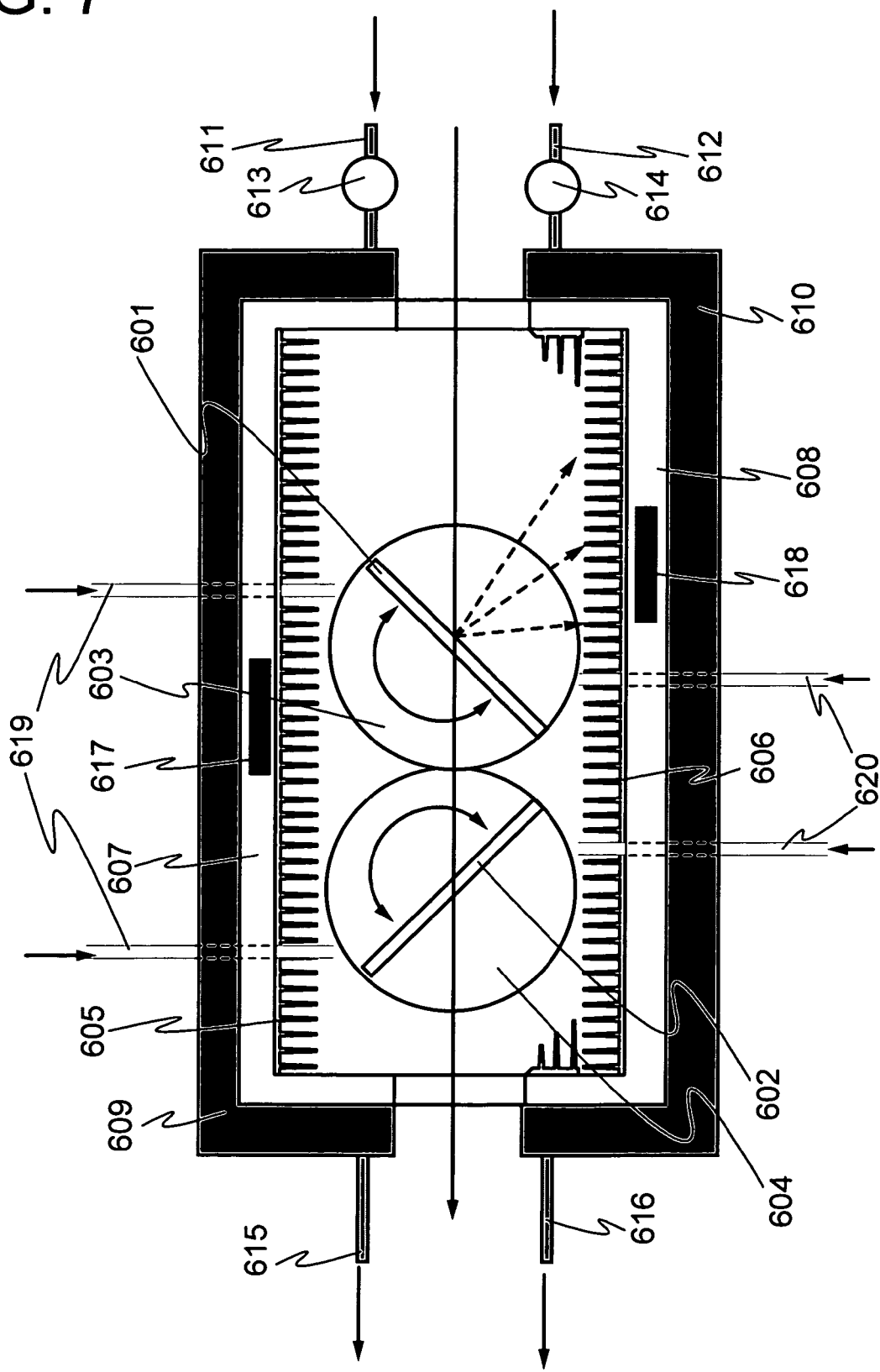
FIG. 7 shows an example of an attenuator disclosed in the present invention.

Here, FIG. 7 shows a configuration of the attenuator 503 used in the apparatus of the present invention. The laser light being incident into the attenuator transmits through an attenuation element 601 and a compensator 602. One side of the attenuation element 601 and opposite sides of the compensator 602 are coated in order to prevent the reflection. A rotating stage 603 can adjust an attenuation ratio, while a rotating stage 604 can adjust an emergence angle of the laser light. The other side of the attenuation element 601 is coated so that the transmittance changes in accordance with an incidence angle of the light. In other words, since the transmittance of the laser light changes due to the incidence angle to the attenuation element 601, the attenuation ratio of the laser light can be controlled by rotating the rotating stage 603 in the attenuator. In addition, because the attenuation element 601 hardly absorbs the laser light, the total of the reflected light and the transmitted light of the laser light in the attenuation element 601 is almost 100%. Therefore, when an angle of attenuation element 601 is changed in order to change the transmittance, an optical path of the reflected light having comparatively high intensity also changes greatly. In addition, the attenuation element 601 has transmittance changed in accordance with the change of the incidence angle, and the optical path of the transmitted light also changes along with it. Therefore, the compensator 602 is employed to prevent such the change. The principle is extremely simple. The optical path is compensated by operating the compensator 602 symmetrically in accordance with the angle of the attenuation element 601.

The laser light reflected in the attenuator is scattered with dampers 605 and 606. A part of the energy of the scattered laser light is absorbed in chambers 607 and 608 as the thermal energy. In the present apparatus, the cooling water is flowed as surrounding the chambers 607 and 608 for the purpose of exhausting the thermal energy. A water meter 613 adjusts the amount of water injected into a cooler 609 from a pipe 611 and the cooling water passed through the cooler is drained away from a pipe 615. In the same manner, a water meter 614 adjusts the amount of water injected into a cooler 610 from a pipe 612 and the cooling water passed through the cooler is drained away from a pipe 616. Temperature sensors 617 and 618 are equipped inside the chambers and the amount of water is adjusted with the water meters 613 and 614 for the purpose of keeping the temperature of the chamber constant.

The above configuration can keep the temperature of the attenuator constant. As a result, it becomes possible to suppress the distortion of the attenuator body or the parts fixing the attenuation element in the attenuator due to the increasing of the temperature of the attenuator and to prevent the energy fluctuation of the transmitted light due to the distortion thereof. In addition, it is possible to keep the irradiation energy of the laser light on the surface to be irradiated constant at an appropriate value. It is noted that FIG. 7 shows an example for water-cooling the attenuator, but the apparatus of the present invention is not limited to this configuration. The apparatus may have a configuration to cool with a cooling element such as a peltiert element.

In addition, in order to prevent the attenuation ratio of the attenuator from changing due to the dust adhesion to the attenuation element 601 and the compensator 602, the apparatus may have a configuration in which the gas such as nitrogen is sprayed to the opposite sides of the attenuation element 601 and the compensator 602 from a pipe 619 and a pipe 620. In addition, the apparatus may have a configuration in which the attenuator is air-cooled and the dust is eliminated while cooling the attenuation element 601 and the compensator 602.

The laser light is adjusted with the above attenuator in the desired energy range and is incident into the optical system. The laser light is processed into linear through the optical system shown in FIG. 5. The laser light is processed into linear in order to improve workability. More specifically, after the linear beam is irradiated from an optical system 504 in FIG. 6, the linear beam is irradiated to a substrate 507 through a total reflection mirror 505. The whole substrate can be irradiated with the laser light by irradiating the linear beam while moving the substrate in X-axis direction and in Y-axis direction. Therefore, the stage for the substrate and a driver device 506 have a simple structure and thereby the maintenance is easy. In addition, the operation for adjusting the position (alignment) when setting the processing object is also easy.

The stage for the substrate irradiated with the laser light and the driver apparatus 506 are controlled with the computer and are designed so as to move in the direction parallel to or in the direction perpendicular to the linear laser light.

The linear beam transmitted through the optical system is incident into the total reflection mirror 505 of FIG. 6. The linear beam reflected by the total reflection mirror 505 is incident into the substrate 507 from the perpendicular direction.

This embodiment employs a XeCl excimer laser as the laser oscillator. The excimer laser is a pulsed laser. The excimer laser can output 1000 mJ per a pulse at the maximum, has a wavelength of 308 nm and has a frequency of 300 Hz at the maximum. When the energy of the pulsed laser light fluctuates within ±5%, preferably within ±1%, in every pulse during the laser irradiation to one substrate, homogeneous crystallization can be performed.

The energy fluctuation of the laser light described above is defined as follows. That is to say, the average value of the laser light energy in the period of the irradiation to one substrate is assumed to be standard. Then, the fluctuation of the laser light energy is defined as the value expressing the difference between the average value and the minimum value in the period of the irradiation or the difference between the average value and the maximum value in the period of the irradiation in percentage terms.

The laser beam is irradiated while scanning the stage with the substrate 507 mounted thereon shown in FIG. 6 in the direction of the minor axis of the linear beam, for example. On this occasion, a practitioner may decide the energy density of the beam spot on the surface to be irradiated and the scanning speed appropriately. The energy density may be appropriate in the range of 200 mJ/cm$^2$ to 1000 mJ/cm$^2$. It is feasible to perform laser annealing homogeneously when the scanning speed is appropriately selected in the range where the width of the linear beam spot in the narrow side direction is overlapped one another by about 90% or more. The optimum scanning speed depends on the frequency of the laser oscillator and it may be regarded to be proportional to the frequency thereof.

In this way, the laser annealing process is completed. When the above-mentioned operation is performed repeatedly, many substrates can be processed. Since the present apparatus can keep the attenuation ratio of the attenuator constant, the substrate can be processed homogeneously, and thereby the apparatus serves many uses. For example, an active matrix liquid crystal display can be manufactured with the substrate.

EMBODIMENTS

Embodiment 1

Figure 8:
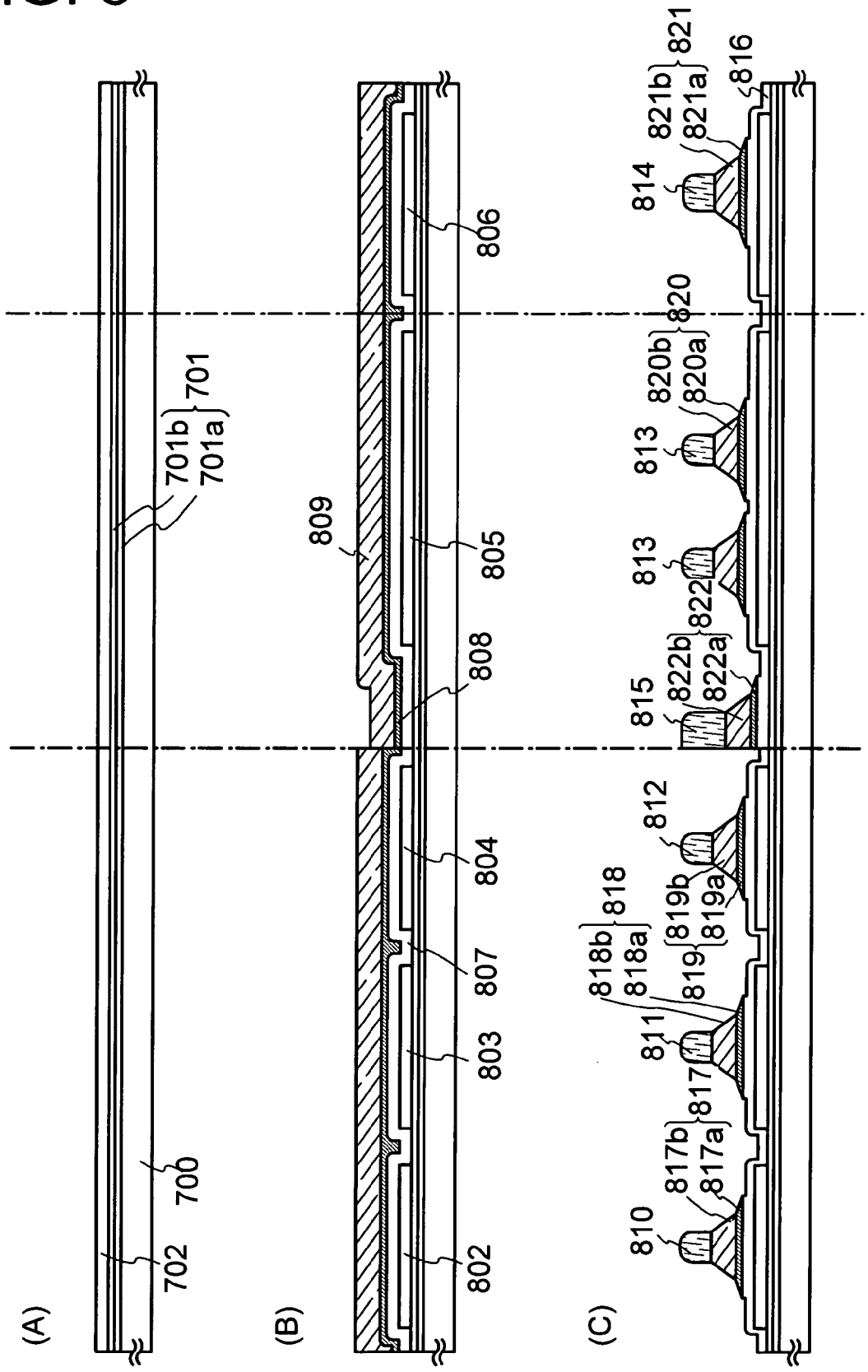
FIG. 8 is a sectional drawing to show a process for manufacturing a pixel TFT and a TFT for a driver circuit.
Figure 9:
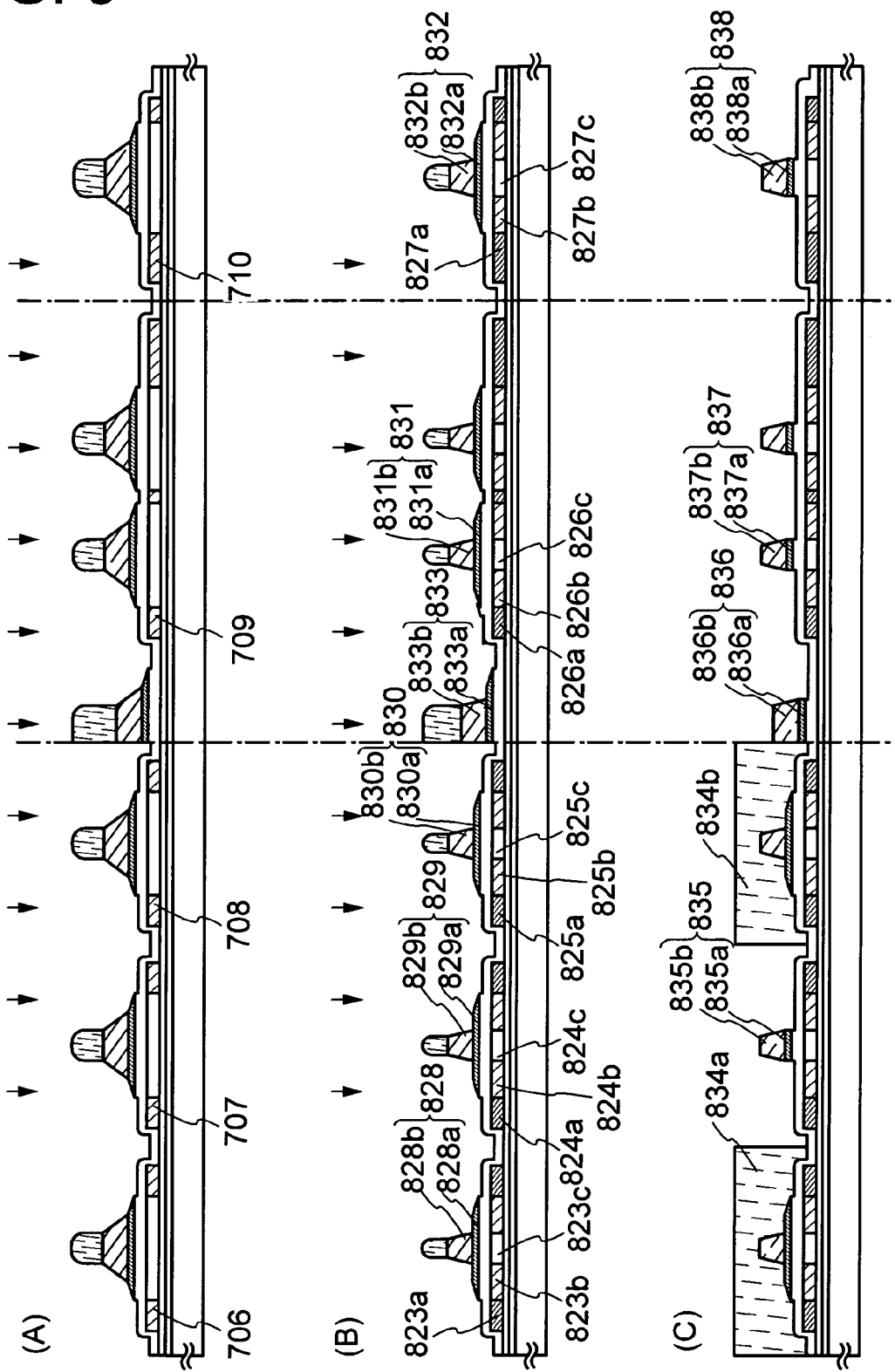
FIG. 9 is a sectional drawing to show a process for manufacturing a pixel TFT and a TFT for a driver circuit.
Figure 10:
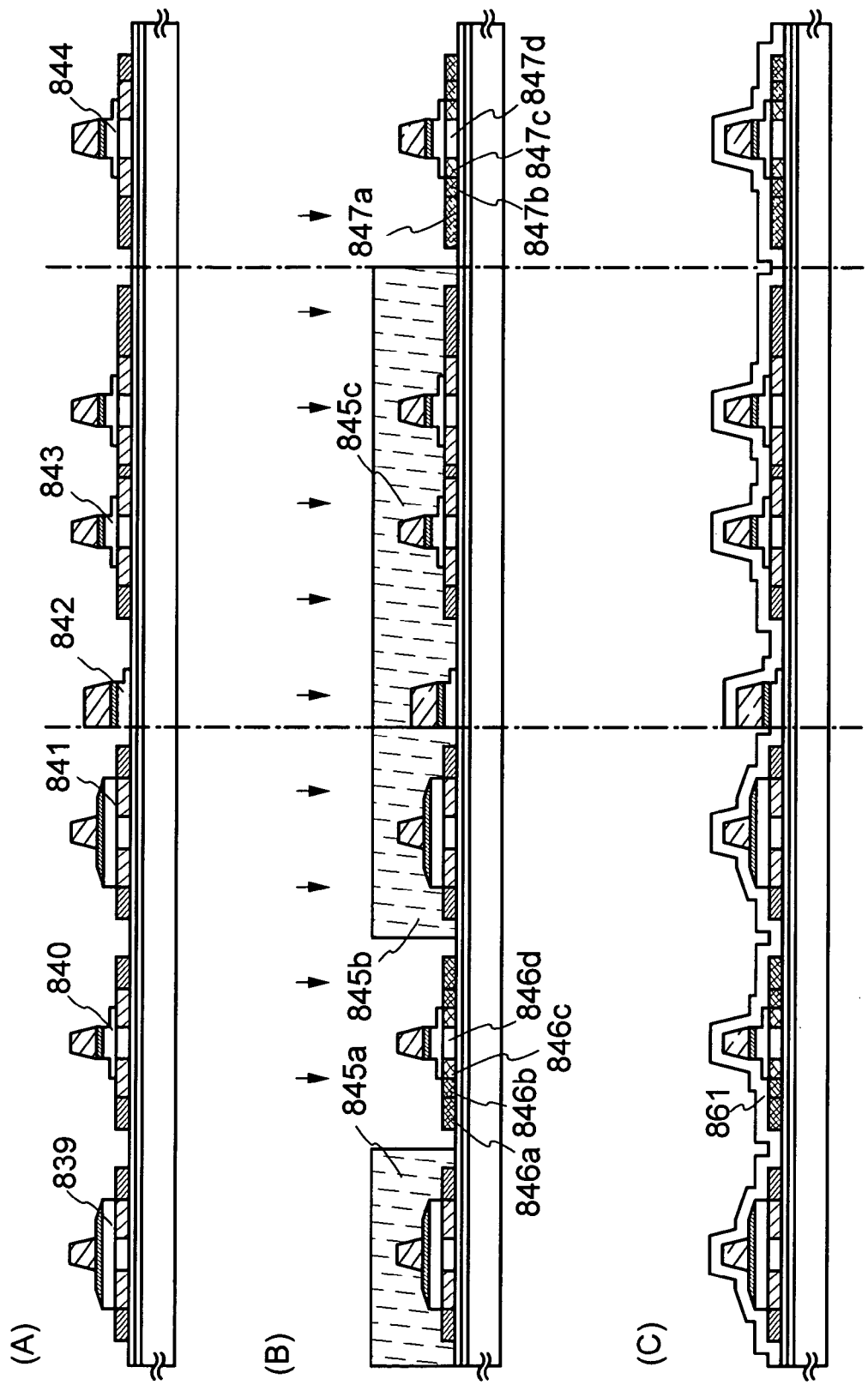
FIG. 10 is a sectional drawing to show a process for manufacturing a pixel TFT and a TFT for a driver circuit.

The present embodiment describes a method of manufacturing an active matrix substrate with FIGS. 8 to 10.

First, a substrate 700 made of a barium borosilicate glass, typically #7059 glass or #1737 glass of Corning, Inc., or an alumino borosilicate glass is used in this embodiment. As the substrate 700, a quartz substrate, a silicon substrate, a metal substrate, or a stainless substrate, on which an insulating film is formed may be also employed. In addition, a plastic substrate having enough heat resistance against the processing temperature in the present embodiment may be also used.

Subsequently, an insulating film such as a silicon oxide film, a silicon nitride film, a silicon oxynitride film or the like is formed over the substrate 700 as a base film 701. Although this embodiment employs a two-layer structure as the base film 701, the base film 701 may be formed of the insulating film in a single-layer structure or in a laminated-layer structure of two or more layers. As a first layer of the base film 701, a silicon oxynitride film 701a is formed in thickness from 10 to 200 nm (preferably from 50 to 100 nm) by the plasma-CVD using $SiH_4$, $NH_3$, and $N_2O$ as reactive gas. In this embodiment, the silicon oxynitride film 701a (composition ratio: Si=32%, O=27%, N=24%, H=17%) having a thickness of 50 nm was formed. Subsequently, a silicon oxynitride film 701b is formed in thickness from 50 to 200 nm (preferably from 100 to 150 nm) by the plasma-CVD using $SiH_4$ and $N_2O$ as reactive gas. In this embodiment, the silicon oxynitride film 701b (composition ratio: Si=32%, O=59%, N=7%, H=2%) having a thickness of 100 nm was formed.

Next, a semiconductor film 702 is formed over the base film. The semiconductor film 702 having an amorphous structure is formed in thickness from 25 to 80 nm (preferably from 30 to 60 nm) by the known method (such as sputtering, LPCVD, plasma-CVD or the like). The material for the semiconductor film is not limited, but it is preferable to use silicon or silicon germanium (SiGe) alloy. Subsequently, a crystalline semiconductor film obtained by performing the laser crystallization method is patterned in a desired shape so as to form semiconductor layers 802 to 806. Of course, not only the laser crystallization method, but also it may be combined with other known crystallization methods (such as RTA, the thermal crystallization method using the annealing furnace and the like, the thermal crystallization method using catalyst such as nickel and the like).

In the laser crystallization method, a pulse oscillation type or a continuous wave type excimer laser, a YAG laser, a $YVO_4$ laser and the like can be used. When these lasers are used, it is preferable that the laser beam output from the laser oscillator is converged into linear through the optical system and the shaped laser beam is irradiated to the semiconductor film. A practitioner may select the condition for crystallization appropriately. When the excimer laser is used, however, the pulse oscillation frequency is set between 30 and 300 Hz, and the energy density of the laser light is set between 100 to 800 $mJ/cm^2$ (typically between 200 and 700 $mJ/cm^2$). In addition, when the YAG laser is used, it is preferable to employ the second harmonic with the pulse oscillation frequency set between 1 and 10000 Hz, and with the energy density of the laser light set between 300 and 1000 $mJ/cm^2$ (typically between 350 and 800 $mJ/cm^2$). Then the whole surface of the substrate is irradiated with the condensed linear laser beam having a width from 100 to 1000 μm, for example 400 μm. In addition, the laser annealing is performed while cooling the attenuator as shown in the embodiment mode.

The plasma-CVD is employed in this embodiment to form an amorphous silicon film in 55 nm thick. After that, the crystalline silicon film is formed with the laser crystallization method applying the method of irradiating laser light of the present invention. This crystalline silicon film is patterned with photolithography method to form semiconductor layers 802 to 806.

After the semiconductor layers 802 to 806 are formed, a small amount of impurities (boron or phosphorous) may be doped in order to control the threshold of a TFT.

Subsequently, a gate insulating film 807 is formed to cover the semiconductor layers 802 to 806. The gate insulating film 807 is formed of the insulating film including silicon having a thickness from 40 to 150 nm with the plasma-CVD or the sputtering. In this embodiment, the gate insulating film 807 was formed of a silicon oxynitride film (composition ratio: Si=32%, O=59%, N=7%, H=2%) having a thickness of 110 nm with the plasma-CVD. Of course, the gate insulating film is not limited to the silicon oxynitride film. The other insulating films including silicon in a single-layer structure or in a laminated-layer structure may be used as the gate insulating film.

In addition, when a silicon oxide film is used, it can be formed by the plasma-CVD with a mixture of TEOS (Tetraethyl Orthosilicate) and $O_2$, at a reaction pressure of 40 Pa, with a substrate temperature set between 300 and 400°, and by discharging at a high frequency (13.56 MHz) with an electric density from 0.5 to 0.8 $W/cm^2$. Thus the manufactured silicon oxide film gets a good characteristic as the gate insulating film by the thermal annealing at a temperature from 400 to 500° thereafter.

Subsequently, a first conductive film 808 having a thickness from 20 to 100 nm and a second conductive film 809 having a thickness from 100 to 400 nm are formed in a laminated-layer structure over the gate insulating film 807 as shown in FIG. 8 (B). In this embodiment, the first conductive film 808 including a TaN film having a thickness of 30 nm, and the second conductive film 809 including a W film having a thickness of 370 nm were formed in a laminated-layer structure. The TaN film was formed with the sputtering, using Ta as a target in the atmosphere including nitrogen. In addition, the W film was formed with the sputtering, using W as a target. In addition, instead of the sputtering, the W film can be also formed with thermal CVD using tungsten hexafluoride ($WF_6$). In any way, in order to use it as a gate electrode, it is necessary to make it low resistant, and thereby it is preferable to make the resistivity of the W film not more than 20 μΩcm. The W film can be made the resistivity low by enlarging its crystal grain, but when the W film includes a large amount of impurity elements such as oxygen, the crystallization is disturbed, and as a result it becomes high resistant. Therefore, in this embodiment, the W film was formed with the sputtering using high-purity W (purity 99.9999%) as a target, and moreover very careful attention was paid when forming the W film so that the impurities in the air may not be incorporated into it. As a result, it became possible to realize the resistivity from 9 to 20 μΩcm.

It is noted that in this embodiment, the first conductive film 808 was formed of TaN, the second conductive film 809 was formed of W, but they are not limited to these elements. Both of the conductive films may be formed of the elements selected from Ta, W, Ti, Mo, Al, Cu, Cr and Nd, or by an alloy material or a chemical compound material including the above element as its main component. In addition, the semiconductor film, typically a crystalline silicon film, with the impurity elements such as phosphorus doped, may be employed. AgPdCu alloy may be also used. In addition, these conductive films may have a structure in which the first conductive film is formed of a tantalum (Ta) film and the second conductive film is formed of a W film, a structure in which the first conductive film is formed of a titanium nitride (TiN) film and the second conductive film is formed of a W film, a structure in which the first conductive film is formed of a tantalum nitride (TaN) film and the second conductive film is formed of an Al film, or a structure in which the first conductive film is formed of a tantalum nitride (TaN) film and the second conductive film is formed of a Cu film.

Next, the photolithography method is employed to form masks made of resist 810 to 815, and a first etching process is performed to form electrodes and wirings. The first etching process is performed in accordance with first and second etching conditions. An ICP (Inductively Coupled Plasma) etching method was employed as the first etching condition in this embodiment. The etching process was performed under the first etching condition in which $CF_4$, $Cl_2$ and $O_2$ were used as the etching gas at a gas flow rate 25/25/10 (sccm) respectively, and plasma was generated by applying 500 W RF (13.56 MHz) electric power to a coil shaped electrode at a pressure of 1 Pa. Here, the dry-etching device using ICP manufactured by Matsushita Electric Industrial Co., Ltd. (Model E645-☐ICP) was used. 150 W RF (13.56 MHz) electric power is also applied to the substrate side (sample stage), and thereby substantially a negative self-bias voltage is impressed. The W film is etched under the first etching condition, and the edge portions of the first conductive layer are made into a tapered shape.

After this, the etching process was performed under the second etching condition without removing the masks made of resist 810 to 815. In the second etching condition, $CF_4$ and $Cl_2$ were used as the etching gas at a gas flow rate 30/30 (sccm) respectively, and plasma was generated by applying 500 W RF (13.56 MHz) electric power to a coil shaped electrode at a pressure of 1 Pa. The etching process was performed for about 30 seconds. 20 W RF (13.56 MHz) electric power is also applied to the substrate side (sample stage), and thereby substantially a negative self-bias voltage is impressed. Under the second etching condition using the mixed gas of $CF_4$ and $Cl_2$, the W film and the TaN film are both etched to the same extent. It is noted that in order to perform the etching process without leaving a remnant on the gate insulating film, the time for etching may be increased by about 10 to 20%.

In the first etching process described above, the end portions of the first and second conductive layers are made into the tapered shape due to the effect of the bias voltage impressed to the substrate side by optimizing the shape of the masks made of resist. And the tapered portions has an angle in the range of 15 to 45°. In this way, the first shaped conductive layers 817 to 822 (laminated layers of the first conductive layers 817*a* to 822*a* and the second conductive layers 817*b* to 822*b*) including the first conductive layer and the second conductive layer are formed by the first etching process. A reference numeral 816 is a gate insulating film. And a region not covered with the first shaped conductive layers 817 to 822 is etched approximately between 20 and 50 nm and thereby regions being thin in the first conductive layers are formed.

Then a first doping process is performed without removing the masks made of resist. The impurity element imparting n-type is doped in the crystalline semiconductor layer (FIG. 9 (A)). The doping process may be performed by an ion doping method or an ion implantation method. The ion doping is performed under the condition in which the dosage ranges from $1\times10^{13}$ to $5\times10^{15}$ atoms/cm$^2$, and the acceleration voltage ranges from 60 to 100 kV. In this embodiment, the dosage was set to $1.5\times10^5$ atoms/cm$^2$ and the acceleration voltage was set to 80 kV. The 15th element, typically phosphorus (P) or arsenic (As), is used as an impurity element imparting n-type. Phosphorus (P) was used here. In such a case, first high-concentration impurity regions 706 to 710 are formed in a self-aligning manner by using the conductive layers 817 to 821 as the masks against the impurity elements imparting n-type. The impurity elements imparting n-type are doped in the first high-concentration impurity regions 706 to 710 at a concentration range from $1\times10^{20}$ to $1\times10^{21}$ atoms/cm$^3$.

Next, a second etching process is performed without removing the masks made of resist. The second etching process is performed under the condition in which $CF_4$, $Cl_2$ and $O_2$ are used as the etching gas to etch the W film selectively. Through the second etching process, the second conductive layers 828*b* to 833*b* are formed. On the other hand, the first conductive layers 817*a* to 822*a* are hardly etched, and thereby the second shaped conductive layers 828 to 833 (laminated layers of the first conductive layers 828*a* to 833*a* and the second conductive layers 828*b* to 833*b*) are formed.

Subsequently, a second doping process is performed as shown in FIG. 9 (B) without removing the masks made of resist. In this case, the dosage is set lower than that in the first doping process, and the impurity elements imparting n-type are doped at a high accelerating voltage range from 70 to 120 kV. In this embodiment, the dosage was set to $1.5\times10^{14}$ atoms/cm$^2$ and the acceleration voltage was set to 90 kV. The second conductive layers 828*b* to 833*b* are used as masks and the second doping process is performed so that the impurity element is doped also in the semiconductor layer provided below the first conductive layers 828*a* to 833*a*, and thus second high-concentration impurity regions 823*a* to 827*a* and low-concentration impurity regions 823*b* to 827*b* are newly formed.

Next, after removing the mask made of resist, new masks 834*a* and 834*b* made of resist are formed, and a third etching process is performed as shown in FIG. 9 (C). $SF_6$ and $Cl_2$ are used as the etching gas at a gas flow rate 50/10 (sccm) respectively and plasma is generated by applying 500 W RF (13.56 MHz) electric power to a coil shaped electrode at a pressure of 1.3 Pa. Then the etching process is performed for about 30 seconds. 10 W RF (13.56 MHz) electric power is also applied to the substrate side (sample stage), and thereby substantially a negative self-bias voltage is impressed. Through the third etching process, the TaN film of p-channel TFT and TFT in a pixel portion (pixel TFT) is etched to form third shaped conductive layers 835 to 838 (laminated layers of the first conductive layers 835*a* to 838*a* and the second conductive layers 835*b* to 838*b*).

Then after removing the mask made of resist, the second shaped conductive layers 828, 830 and the third shaped conductive layers 835 to 838 are used as the masks to remove the gate insulating film 816 selectively so as to form insulating layers 839 to 844 (FIG. 10 (A)).

Next, after forming new masks 845*a* to 845*c* made of resist, a third doping process is performed. Through the third doping process, impurity regions 846*a-c* and 847*a-c*, which are doped with the impurity elements imparting conductivity type opposite to the former conductivity type are formed in the semiconductor layer that will be an active layer of the p-channel TFT. The third shaped conductive layers 835 and 838 are used as the masks against the impurity elements and the impurity element imparting p-type is doped to form the impurity region in a self-aligning manner. In this embodiment, the impurity regions 846a-c and 847a-c are formed by the ion doping with diborane ($B_2H_6$). (FIG. 10 (B)) Through the third doping process, the semiconductor layer forming n-channel TFT is covered with the masks 845a to 845c made of resist. Although phosphorus is doped to the impurity regions 846a-c and 847a-c at a different concentration respectively through the first and the second doping processes, the doping processes are performed so that the concentration of the impurity elements imparting p-type may be between $2\times10^{20}$ and $2\times10^{21}$ atoms/cm$^3$ in both regions, and thereby these regions work as the source region and the drain region of p-channel TFT and the like without any problems. In this embodiment, since a part of the semiconductor layer that will be the active layer of p-channel TFT is exposed, it has an advantage that the impurity element (boron) is easily doped.

The impurity region is formed in each semiconductor layer according to the above processes. Subsequently, a heating process is performed and the masks 845a to 845c made of resist are removed in order to form a first interlayer insulating film 861 as shown in FIG. 10(c). The first interlayer insulating film 861 is formed of the insulating film including silicon in thickness from 100 to 200 nm with the plasma-CVD or the sputtering. In this embodiment, a silicon oxynitride film was formed in 150 nm thickness with the plasma-CVD. Of course, the first interlayer insulating film 861 is not limited to the silicon oxynitride film, and it may be formed of other insulating films including silicon in a single-layer structure or in a laminated-layer structure.

Next, a heating process is performed to recover the crystallinity of the semiconductor layer and to activate the impurity element added in the respective semiconductor layers. This heating process is performed with the thermal annealing method using an annealing furnace. The thermal annealing may be performed in the atmosphere of nitrogen including oxygen not more than 1 ppm, preferably not more than 0.1 ppm, at a temperature between 400 and 700°, typically between 500 and 550°. In this embodiment, the heating process was performed at a temperature of 550° for four hours for the activating process. Not only the thermal annealing method, but also the laser annealing method and the rapid thermal annealing method (RTA method) can be employed. As for the laser annealing method, it is preferable to employ the method shown in the embodiment mode.

In addition, a heating process may be performed before forming the first interlayer insulating film. However, when the material for the wirings does not have enough resistance against heat, it is preferable that the interlayer insulating film (such as the insulating film including silicon as its main component, for example a silicon nitride film) is formed in order to protect the wirings and the like before the activating process as shown in this embodiment.

Furthermore, a heating process is performed in the atmosphere including hydrogen in the range of 3 to 100% at a temperature from 300 to 550° for 1 to 12 hours in order to hydrogenate the semiconductor layer. In this embodiment, the heating process was performed in the atmosphere of nitrogen including hydrogen for about 3% at a temperature of 410° for one hour. This process is to terminate the dangling bond in the semiconductor layer with hydrogen included in the interlayer insulating film. As the other means for hydrogenation, plasma hydrogenation (using hydrogen excited by plasma) may be performed. Alternatively, the hydrogenation may be performed in such a way that a film including hydrogen is used as the first interlayer insulating film 861 and that the heating process is performed thereafter in order to hydrogenate using hydrogen in the film.

When the laser annealing method is employed as the activation process, it is preferable to irradiate the laser beam such as the excimer laser, the YAG laser or the like after the hydrogenation.

Next, a second interlayer insulating film 862 made of an inorganic insulating material or an organic insulating material is formed on the first interlayer insulating film 861. In this embodiment, the second interlayer insulating film 862 was formed of an acrylic resin film having a thickness of 1.6 µm, and having a viscosity from 10 to 1000 cp, preferably from 40 to 200 cp, whose surface is not made concave and convex. After forming a pixel electrode, the known sandblasting method, etching method or the like is added in order to make the surface convex and concave, and to prevent the mirror reflection. The mirror reflection can be prevented by scattering the reflected light so as to increase the degree of whiteness.

In order to prevent the mirror reflection, convexity and concavity may be formed on the surface of the pixel electrode by forming the second interlayer insulating film on which the convexity and concavity can be formed on the surface. And a convex portion may be formed in the region below the pixel electrode in order to scatter the light by making the surface of the pixel electrode concave and convex. In such a case, the convex portion can be formed with the same photo mask forming the TFT, and thereby the number of the processes does not need to be increased. It is noted that the convex portion may be provided in the pixel portion region except for the wirings and TFT on the substrate appropriately. Convexity and concavity are thus formed on the surface of the pixel electrode along the convexity and concavity formed on the surface of the insulating film covering the convex portion.

And in a driver circuit 906, wirings 863 to 867 connecting electrically to each impurity regions respectively are formed. It is noted that these wirings are formed by patterning the laminated film of the Ti film having a thickness of 50 nm and an alloy film (alloy film of Al and Ti) having a thickness of 500 nm.

Figure 11:
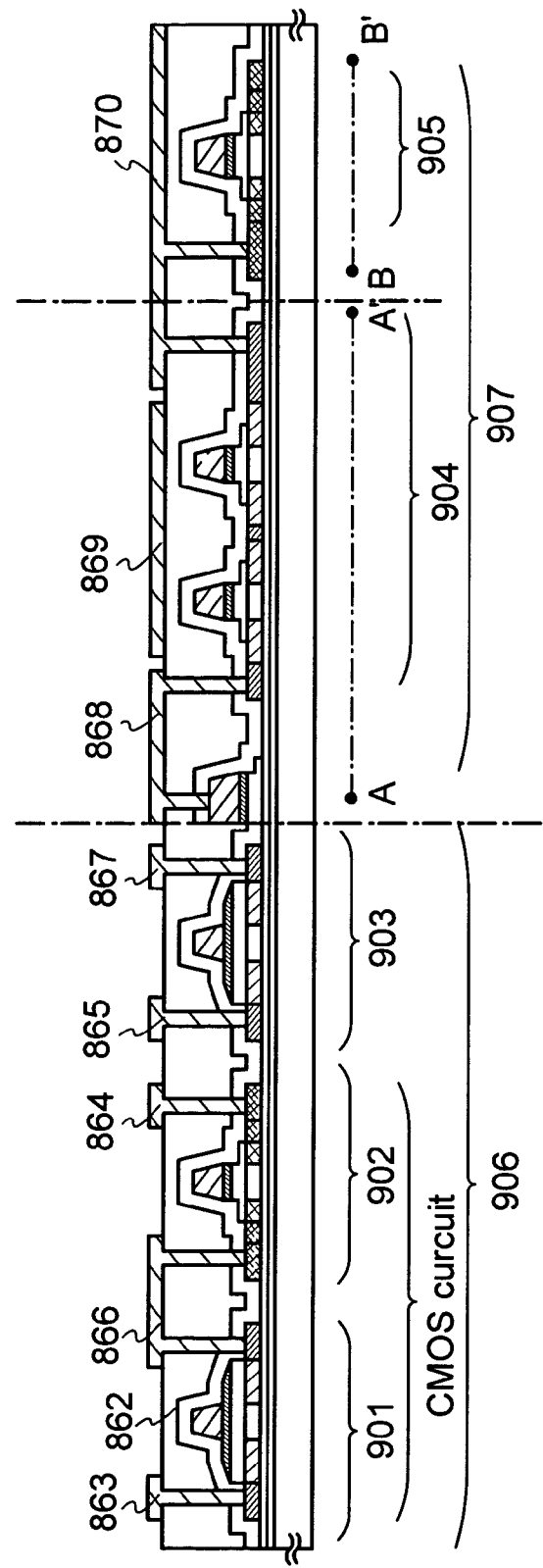
FIG. 11 is a sectional drawing to show a process for manufacturing a pixel TFT and a TFT for a driver circuit.

In the pixel portion 907, a pixel electrode 870, a gate wiring 869, and a connecting electrode 868 are formed (FIG. 11). The connecting electrode 868 forms an electrical connection between the source wiring 836 (the laminated layer of 836a and 836b) and the pixel TFT. In addition, the gate wiring 869 and the gate electrode of the pixel TFT are electrically connected. Moreover, the pixel electrode 870 is electrically connected with the drain region 826a of the pixel TFT and is further electrically connected with the semiconductor layer 827b to function as an electrode of a storage capacitor. In addition, it is preferable that the pixel electrode 870 is formed of the material with high reflectivity such as a film including Al or Ag as its main component or a laminated layer of the above films.

With these procedures, a driver circuit 906 having a CMOS circuit including n-channel TFT 901 and p-channel TFT 902, and having a n-channel TFT 903, and a pixel portion 907 having a pixel TFT 904 and a storage capacitor 905 can be integrated on the same substrate. Thus an active matrix substrate is completed.

The n-channel TFT 901 in the driver circuit 906 has a channel forming region 823c, a low-concentration impurity region 823b (GOLD region) overlapping with the first conductive layer 828a constituting a part of the gate electrode, and a high-concentration impurity region 823a functioning as a source region or a drain region. The p-channel TFT 902 forming a CMOS circuit by connecting this n-channel TFT 901 with the electrode 866 has a channel forming region 824c, impurity regions 824b formed outside the gate electrode, and a high-concentration impurity region 824a functioning as a source region or a drain region. Moreover, the n-channel TFT 903 has a channel forming region 825c, a low-concentration impurity region 825b (GOLD region) overlapping with the first conductive layer 830a constituting a part of the gate electrode, and a high-concentration impurity region 825a functioning as a source region or a drain region.

The pixel TFT 904 in the pixel portion has a channel forming region 826c, a low-concentration impurity region 826b (LDD region) formed outside the gate electrode, and a high-concentration impurity region 826a functioning as a source region or a drain region. And the impurity elements imparting p-type are doped in the periphery of the semiconductor layer 847d functioning as one electrode of the storage capacitor 905. The storage capacitor 905 is formed of the insulating film 844 as its dielectric, the electrode 832 (the laminated layer of 832a and 832b), and the semiconductor layer 847d.

In addition, the pixel structure in this embodiment is formed so as to shield the space between the pixel electrodes from the light by having the ends of the pixel electrodes overlapped with the source wirings without forming black matrix.

Figure 12:
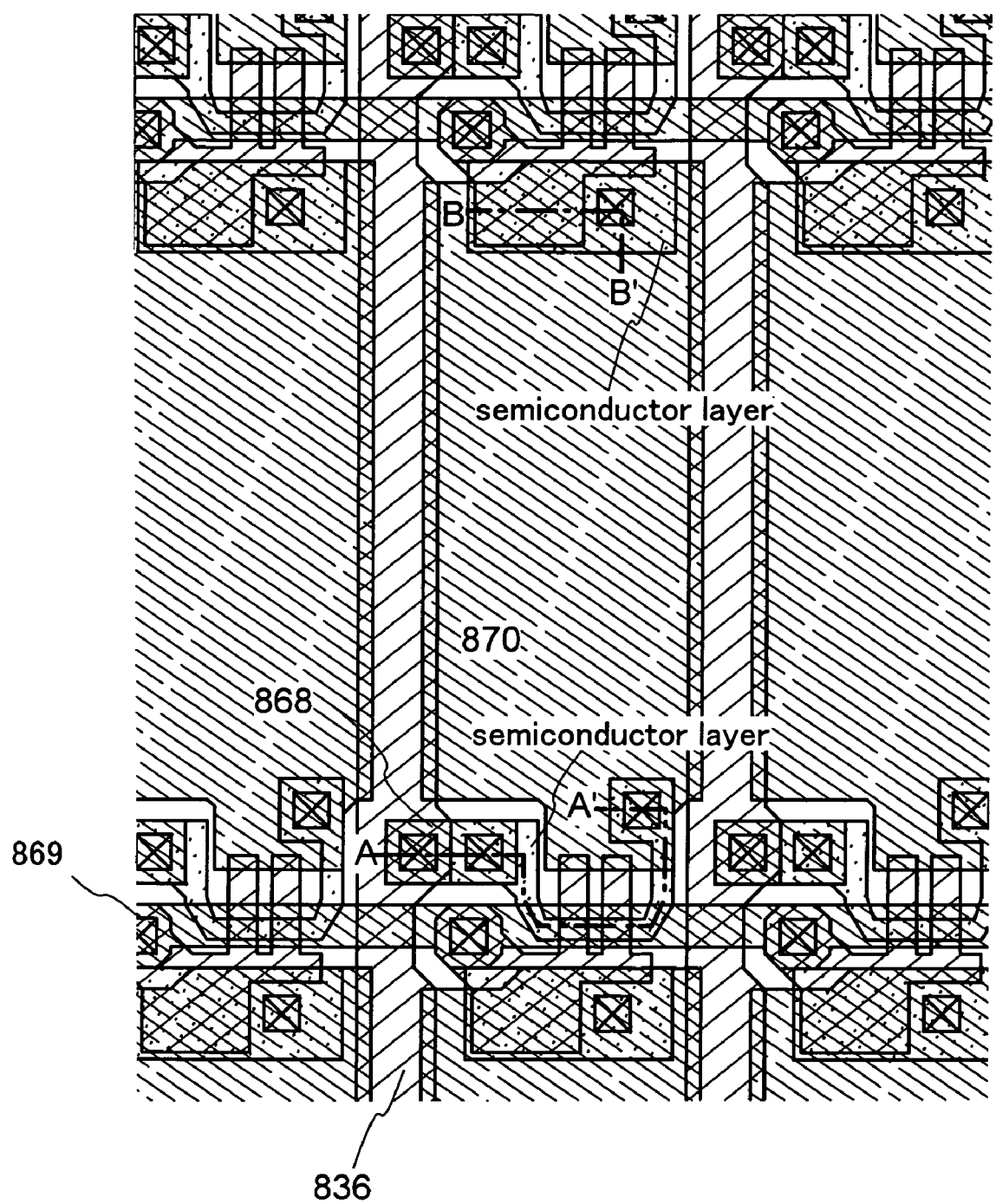
FIG. 12 is a sectional drawing to show a structure of a pixel TFT.

FIG. 12 shows a top view of the pixel portion in the active matrix substrate manufactured in this embodiment. It is noted that the same symbols are used in the same parts in FIGS. 8 to 11. A dotted line A-A' in FIG. 11 corresponds to a sectional view cut off by a dotted line A-A' in FIG. 12. Moreover, a dotted line B-B' in FIG. 11 corresponds to a sectional view cut off by a dotted line B-B' in FIG. 12.

Embodiment 2

Figure 13:
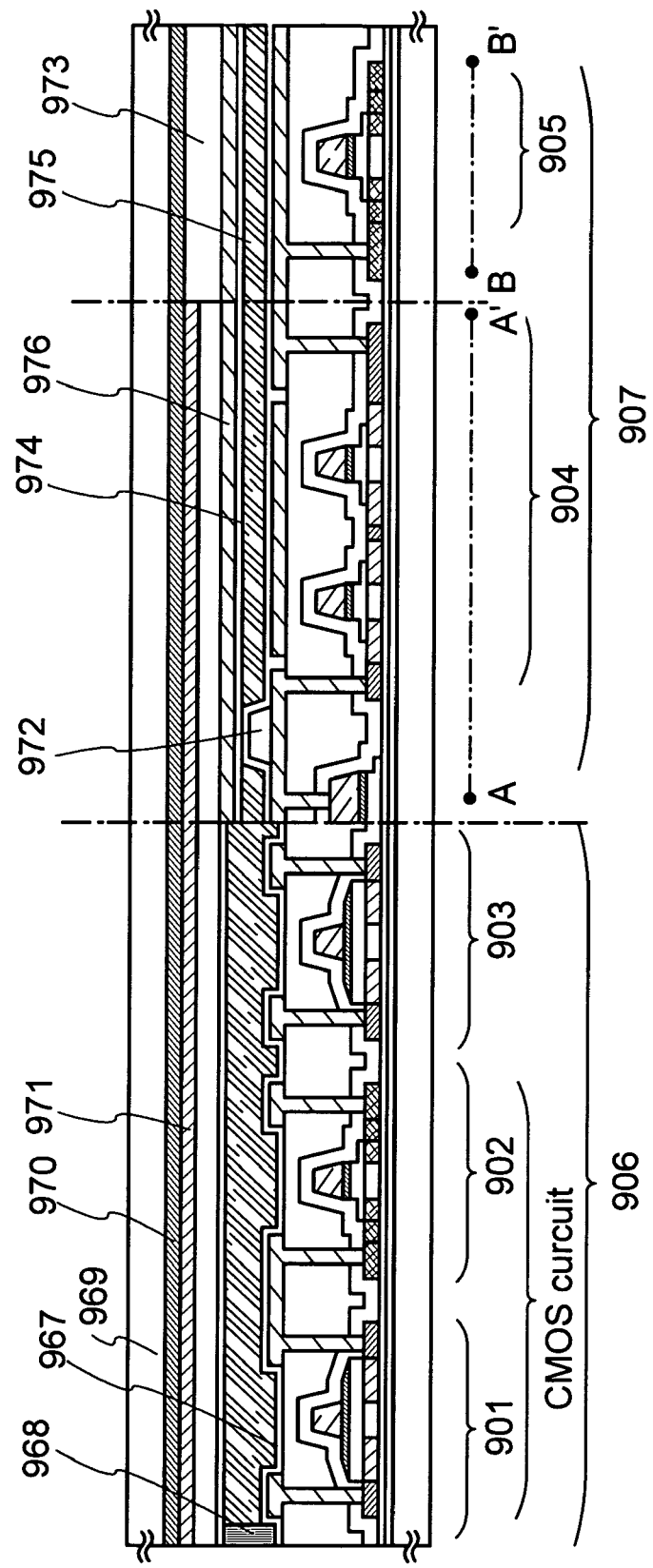
FIG. 13 is a sectional drawing to show a process for manufacturing an active matrix type liquid crystal display device.

This embodiment explains a process to manufacture a liquid crystal display device of reflecting type from the active matrix substrate manufactured in the embodiment 1. FIG. 13 is used for the explanation.

First of all, the active matrix substrate in a state shown in FIG. 11 is obtained according to the processes in the embodiment 1. Then, an alignment film 967 is formed on the active matrix substrate in FIG. 11, at least on the pixel electrode 870, and is performed in rubbing process. It is noted that before forming the alignment film 967, a columnar spacer 972 was formed in the desired position in order to keep distance between the substrates by patterning the organic resin film such as the acrylic resin film in this embodiment. Spherical spacers may be dispersed all over the substrate instead of the columnar spacer.

Next, an opposing substrate 969 is prepared. Then, a coloring layer 970 and a planarizing film 973 are formed on the opposing substrate 969. The red coloring layer 970 and the blue coloring layer 971 are overlapped to form a light-shielding portion. Alternatively the red coloring layer and the green coloring layer may be overlapped partially to form the light-shielding portion.

In this embodiment, the substrate shown in the embodiment 1 is used. Therefore, in FIG. 12 showing the top view of the pixel portion in the embodiment 1, it is necessary to shield at least the following spaces from the light; a space between the gate wiring 869 and the pixel electrode 870, a space between the gate wiring 869 and the connecting electrode 868, and a space between the connecting electrode 868 and the pixel electrode 870. In this embodiment, each coloring layer was arranged so that the light-shielding portions comprising the laminated coloring layers were overlapped on the position which should be shielded from the light as described above, and the opposing substrate was then pasted.

Thus it became possible to reduce the number of processes by shielding the spaces between each pixel from the light with the light-shielding portion, made of the laminated coloring layers, without forming a light-shielding layer such as a black mask.

Next, an opposing electrode 976 made of a transparent conductive film was formed on the planarizing film 973, at least on the pixel portion, and then an alignment film 974 was formed all over the surface of the opposing substrate 969 and was performed in rubbing process.

And the active matrix substrate in which the pixel portions and the driver circuits are formed is pasted to the opposing substrate with a sealing material 968. Filler is contained in the sealing material 968 and the two substrates are pasted while keeping a uniform distance by this filler and the columnar spacer. After that, liquid crystal material 975 is injected between the substrates and the two substrates are sealed with sealant (not shown) completely. The known liquid crystal material may be employed for the liquid crystal material 975. Thus the liquid crystal display device of reflection type is completed as shown in FIG. 13. And if necessary, the active matrix substrate or the opposing substrate is cut into a desired shape. Moreover, a polarization plate (not shown) was pasted only to the opposing substrate. And FPC was pasted with the known technique.

The liquid crystal display device thus manufactured can be employed for the display portion in various kinds of the electrical devices.

It is noted that this embodiment can be freely combined with embodiment 1.

Embodiment 3

This embodiment explains an example in which the present invention is applied to manufacture a light-emitting device. In this specification, the light-emitting device is a generic term for a display panel where a light-emitting element formed on the substrate is included between the substrate and the cover member, and for a display module where the display panel is equipped with IC. It is noted that the light-emitting element has a layer including an organic compound generated luminescence (Electroluminescence) by applying electric field (light-emitting layer), an anode layer and a cathode layer. And the luminescence in the organic compound includes either or both of the luminescence (fluorescence) when returning from the singlet excited state to the ground state, and the luminescence (phosphorescence) when returning from the triplet excited state to the ground state.

Figure 14:
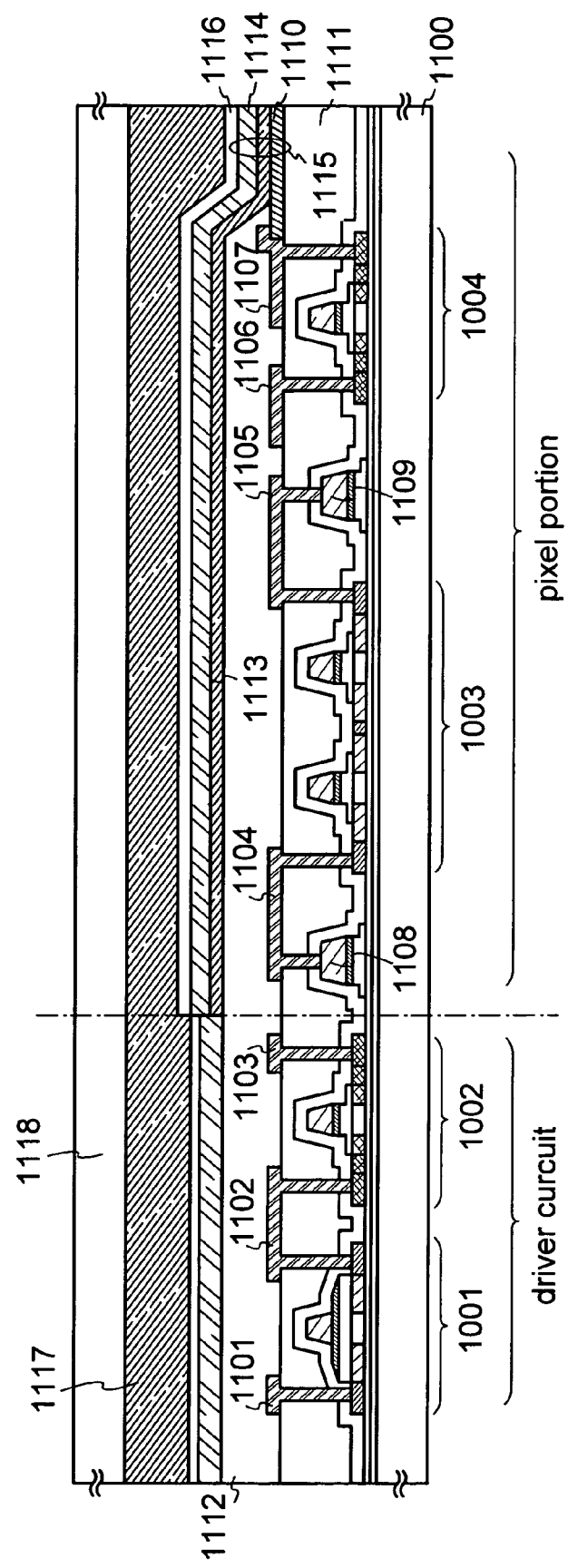
FIG. 14 is a sectional structure drawing of a driver circuit and a pixel portion of a light-emitting device.

FIG. 14 is a sectional view of the light-emitting device in this embodiment. In FIG. 14, a switching TFT 1003 provided on the substrate 1100 is formed using the pixel TFT 904 in FIG. 11. Therefore, concerning the structure, the explanation of the pixel TFT 904 may be referred to.

It is noted that although this embodiment explains a double-gate structure in which two channel forming regions are formed, a single-gate structure in which one channel forming region is formed or a triple-gate structure in which three channel forming regions are formed may be also employed.

The driver circuit provided on the substrate 1100 (a plastic substrate is employed in this embodiment) is formed using the CMOS circuit in FIG. 11. Therefore, concerning the structure, the explanation about the structure of the n-channel TFT 901 and p-channel TFT 902 may be referred to. It is noted that this embodiment explains a single-gate structure, but a double-gate structure or a triple-gate structure may be also employed.

It is noted that the wirings 1101 and 1103 function as the source wiring of the CMOS circuit, and the wiring 1102 functions as the drain wiring of the CMOS circuit. In addition, the wiring 1104 functions as the wiring that electrically connects the source wiring 1108 with the source region of the switching TFT. The wiring 1105 functions as the wiring that connects electrically the drain wiring 1109 and the drain region of the switching TFT.

It is noted that a current controlling TFT 1004 is formed using the p-channel TFT 902 in FIG. 11. Therefore, concerning the structure, the explanation of the p-channel TFT 902 may be referred to. It is noted that in this embodiment, it is formed in a single-gate structure, but may be also formed in a double-gate or a triple-gate structure.

The wiring 1106 is the source wiring of the current controlling TFT (corresponding to a current supply line) and a reference numeral 1107 is an electrode connecting electrically with a pixel electrode 1110 of the current controlling TFT by being overlapped on the pixel electrode 1110 thereof.

It is noted that a reference numeral 1110 is the pixel electrode (the anode of the light-emitting element) comprising the transparent conductive film. The transparent conductive film can be formed of a compound of indium oxide and tin oxide, a compound of indium oxide and zinc oxide, zinc oxide, tin oxide, or indium oxide. Moreover, the transparent conductive film added with gallium may be also employed. The pixel electrode 1110 is formed on the plane interlayer insulating film 1111 before forming those wirings. In this embodiment, it is very important to planarize the steps due to the TFT with a planarizing film 1111 made from resin. The light-emitting layer that is formed later is so thin that the faulty luminance might occur due to the steps. Therefore, it is preferable to planarize before forming the pixel electrode so that the light-emitting layer is formed on the plane as even as possible.

After forming the wirings 1101 to 1107, a bank 1112 is formed as shown in FIG. 14. The bank 1112 may be formed by patterning the insulating film including silicon, or the organic resin film, having a thickness from 100 to 400 nm.

It is noted that attention must be paid for the element when the bank 1112 is formed so that the element may not be damaged due to electrostatic discharge because the bank 1112 is an insulating film. In this embodiment, the resistivity is lowered by adding a carbon particle or a metal particle in the insulating film, that is a material for the bank 1112, so as to suppress the generation of static electricity. In such a case, the added amount of the carbon particle or the metal particle may be adjusted so that the resistivity is in the range of $1 \times 10^6$ to $1 \times 10^{12}$ Ωm (preferably from $1 \times 10^8$ to $1 \times 10^{10}$ Ωm).

A light-emitting layer 1113 is formed on the pixel electrode 1110. It is noted that FIG. 14 shows only one pixel but in this embodiment the light-emitting layers are made in parts corresponding to each color of R (red), G (green) and B (blue). In addition, in this embodiment, low molecular weight organic light-emitting material is formed by an evaporation method. Specifically, a laminated-layer structure is employed in which a copper phthalocyanine (CuPc) film having a thickness of 20 nm is formed as the hole injecting layer, and a tris-8-quinolinolato aluminum complex ($Alq_3$) film having a thickness of 70 nm is formed thereon as the light-emitting layer. Adding the fluorescent pigment such as quinacridone, perylene, DCM1 or the like to $Alq_3$ can control the light-emitting color.

However, the organic light-emitting material available for the light-emitting layer is not limited to those described above at all. A light-emitting layer, a charge transporting layer, and a charge injecting layer are freely combined to form the light-emitting layer (the layer for luminescence and for moving the carrier for the luminescence). For instance, this embodiment shows an example in which the low molecular weight organic light-emitting material is employed for the light-emitting layer, but the high molecular weight organic light-emitting material may be also employed. In addition, an inorganic material such as silicon carbide can be also used as the charge transporting layer and the charge injecting layer. Any known material can be used for these organic light-emitting material and inorganic material.

Next, a cathode 1114 including the conductive film is provided on a light-emitting layer 1113. In case of this embodiment, an alloy film of aluminum and lithium is used as the conductive film. Of course, the known MgAg film (the alloy film of magnesium and silver) can be also used. A conductive film formed with the first or second element in the periodic table or a conductive film added with these elements can be used as the cathode material.

When the processes up to forming the cathode 1114 are performed, the light-emitting element 1115 is completed. It is noted that the light-emitting element 1115 described here indicates a diode formed by the pixel electrode (anode) 1110, the light-emitting layer 1113 and the cathode 1114.

It is effective to provide a passivation film 1116 so as to cover the light-emitting element 1115 completely. The passivation film 1116 is formed of the insulating film including a carbon film, a silicon nitride film, or a silicon nitride oxide film, in a single-layer or in a laminated-layer structure combined.

Here, it is preferable to employ the film whose coverage is good as the passivation film, and it is effective to employ the carbon film, especially a DLC (Diamond Like Carbon) film. The DLC film can be formed at a temperature ranging from the room temperature to 100°. Therefore, the DLC film can be easily formed over the light-emitting layer 1113 having low resistance against heat. Moreover, the DLC film is superior in its blocking effect against oxygen, and thereby it is possible to suppress oxidization of the light-emitting layer 1113. Therefore, it can prevent the light-emitting layer 1113 from being oxidized during the following sealing process.

Moreover, a sealant 1117 is provided on the passivation film 1116 to paste a cover member 1118. A UV cured resin may be used as the sealant 1117 and it is effective to provide an absorbent material or antioxidant material inside. In addition, in this embodiment, the cover member 1118 is a glass substrate, a quartz substrate, or a plastic substrate (including a plastic film), having carbon films (preferably Diamond Like Carbon films) formed on opposite sides of the substrate.

Thus a light-emitting device having a structure shown in FIG. 14 is completed. It is effective to perform continuously all the processes from forming the bank 1112 up to forming the passivation film 1116 in the deposition system of multi-chamber type (or in-line type) without releasing it to the air. Furthermore, it is possible to have the further processes up to pasting the cover member 1118 performed continuously without releasing it to the air.

Thus, a n-channel TFT 1001, a p-channel TFT 1002, the switching TFT (n-channel TFT) 1003, and a current controlling TFT (n-channel TFT) 1004 are formed on the plastic substrate 1100. The number of masks needed in these manufacturing processes is less than that in manufacturing a general active matrix light-emitting device. That is to say, the process for manufacturing TFT is simplified to a large degree, and thereby the yield can be improved and the manufacturing cost can be reduced.

In addition, as explained with FIG. 14, providing an impurity region overlapped by the gate electrode through the insulating film can form the n-channel TFT that has enough resistance against deterioration due to the hot-carrier effect. Therefore, the light-emitting device with high reliability can be obtained.

Although this embodiment shows only the structure of the pixel portion and the driver circuit, another logic circuit such as a signal divider circuit, a D/A converter, an operational amplifier, a γ correction circuit and the like can be further formed on the same insulating substrate according to the manufacturing processes in this embodiment. Moreover, a memory and a microprocessor can be further formed.

Figure 15:
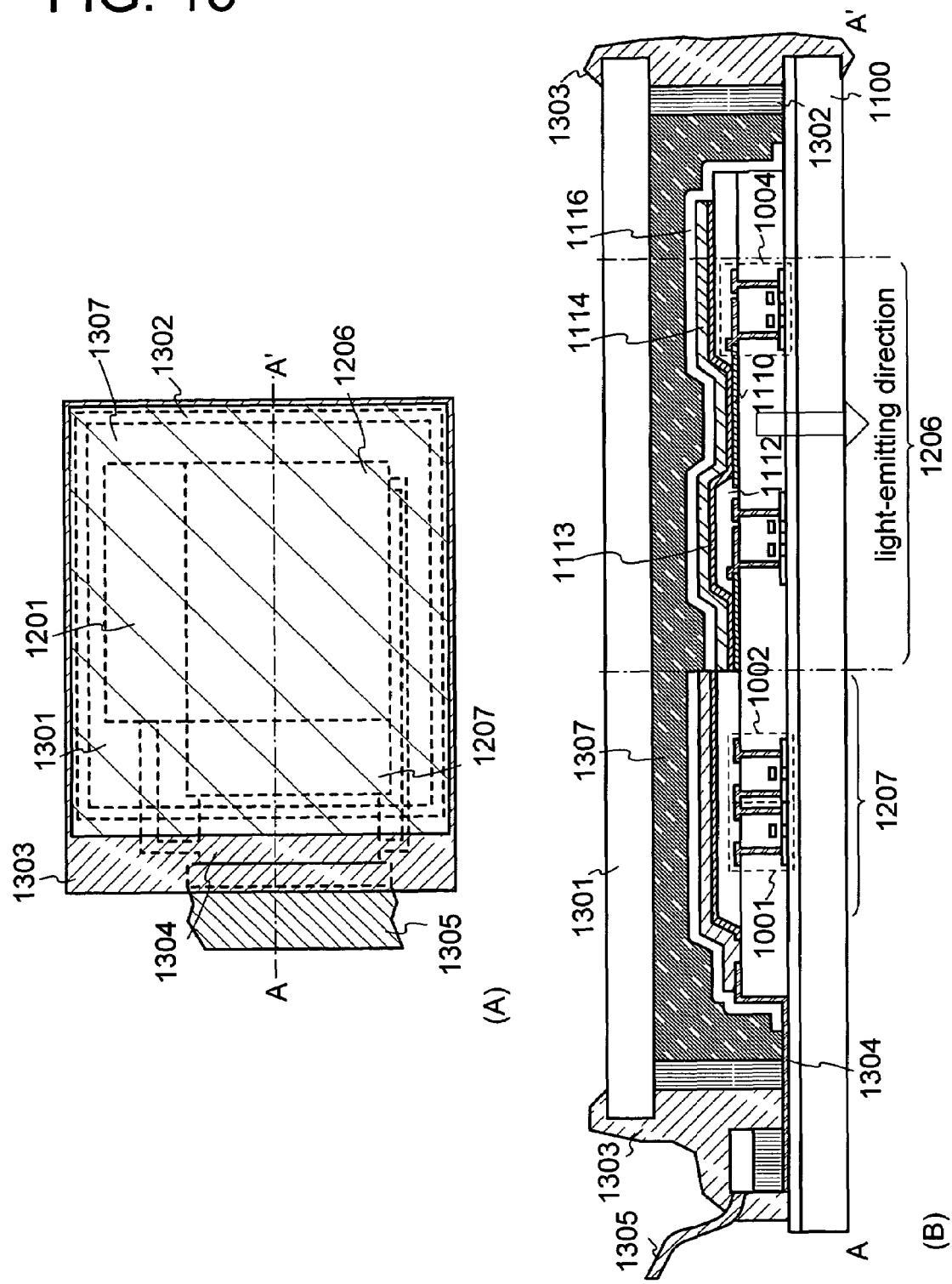
FIG. 15(A) is a top view of a light-emitting device.
FIG. 15(B) is a sectional structure drawing of a driver circuit and a pixel portion of a light-emitting device.

Furthermore, a light-emitting device in this embodiment in which a process up to sealing (or inclusion) in order to protect the light-emitting element is performed, is explained with FIG. 15. It is noted that a symbol used in FIG. 14 is referred to if necessary.

FIG. 15 (A) is a top view to show an aspect in which the processes up to sealing the light-emitting element are performed. FIG. 15 (B) is a sectional view cut off by A-A' in FIG. 15 (A). A reference numeral 1201 drawn with a dotted line is a driver circuit on the source side, a reference numeral 1206 is a pixel portion, and a reference numeral 1207 is a driver circuit on the gate side. In addition, a reference numeral 1301 is a cover member, 1302 is a first sealing material, 1303 is a second sealing material, and a sealant 1307 is provided in the space surrounded by the first sealing material 1302.

It is noted that a reference numeral 1304 is a wiring to transmit a signal input in the driver circuit on the source side 1201 and the driver circuit on the gate side 1207, and it receives a video signal or a clock signal from a FPC (flexible print circuit) 1305 that is an external input terminal. In addition, although only FPC is shown diagrammatically, this FPC may be equipped with a printed-wiring board (PWB). The light-emitting device in this specification includes not only the light-emitting device body, but also the light-emitting device equipped with FPC or PWB.

Next, the sectional structure is explained with FIG. 15 (B). The pixel portion 1206 and the driver circuit on the gate side 1207 are formed above the substrate 1100. The pixel portion 1206 is formed by the current controlling TFT 1004 and a plurality of pixels including the pixel electrode 1110 connected electrically with the drain thereof. In addition, the driver circuit on the gate side 1207 is formed using a CMOS circuit (refer to FIG. 8) in which the n-channel TFT 1001 and the p-channel TFT 1002 are combined.

The pixel electrode 1110 functions as the anode of the light-emitting element. In addition, the bank 1112 is formed on opposite ends of the pixel electrode 1110, and the light-emitting layer 1113 and the cathode 1114 of the light-emitting element are formed over the pixel electrode 1110.

The cathode 1114 also functions as the wiring common to all the pixels and is connected electrically to the FPC 1305 through the connecting wiring 1304. Further, all the elements included in the pixel portion 1206 and the driver circuit on the gate side 1207 are covered with the cathode 1114 and the passivation film 1116.

Moreover, the cover member 1301 is pasted with the first sealing material 1302. It is noted that a spacer made from a resin film may be provided in order to keep the space between the cover member 1301 and the light-emitting element. And the sealant 1307 is filled inside the first sealing material 1302. It is preferable to employ epoxy resin as the first sealing material 1302 and the sealant 1307. In addition, it is desirable to employ the first sealing material 1302 that is as hard as possible to transmit moisture and oxygen. Moreover, the material having moisture-absorption characteristic or the material providing protection against oxidization may be included inside the sealant 1307.

The sealant 1307 provided so as to cover the light-emitting element also functions as an adhesive material in order to adhere the cover member 1301. In addition, FRP (Fiberglass-Reinforced Plastics), PVF (polyvinyl fluoride), mylar, polyester, or acrylic can be employed as the material for a plastic substrate 1100 constituting the cover member 1301 in this embodiment.

In addition, after adhering the cover member 1301 with the sealant 1307, the second sealing material 1303 is provided so as to cover the side surface (the exposed side) of the sealant 1307. The second sealing material 1303 can be formed of the same material as that of the first sealing material 1302.

Enclosing the light-emitting element into the sealant 1307 with the above structure makes it possible to shield the light-emitting element completely from outside, and thereby the material such as moisture and oxygen promoting deterioration due to oxidization of the light-emitting layer can be prevented from intruding from outside. Therefore, a light-emitting device with high reliability can be obtained.

It is noted that this embodiment can be freely combined with embodiment 1 or 2.

Embodiment 4

Figure 16:
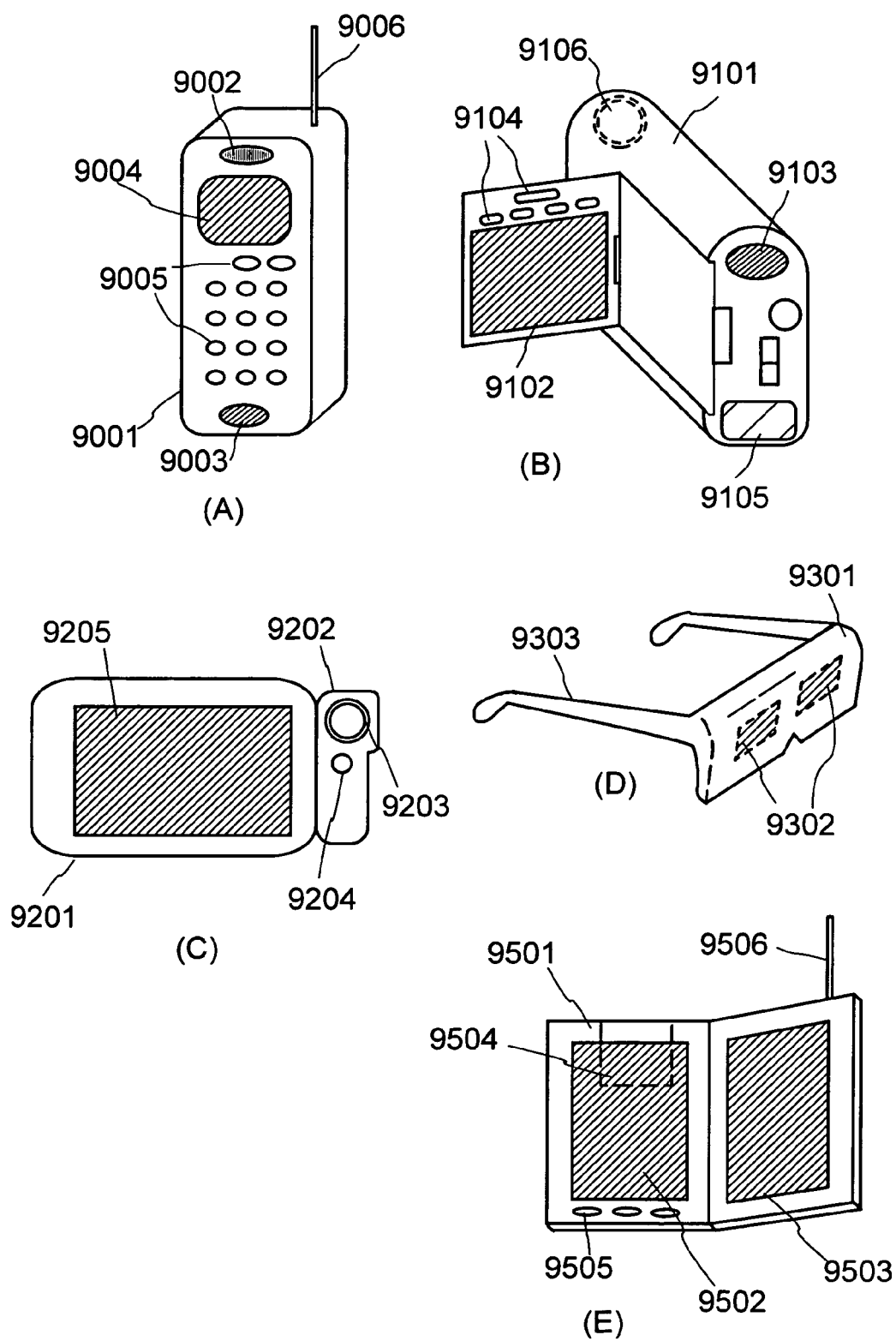
FIG. 16 shows an example of a semiconductor device.
Figure 17:
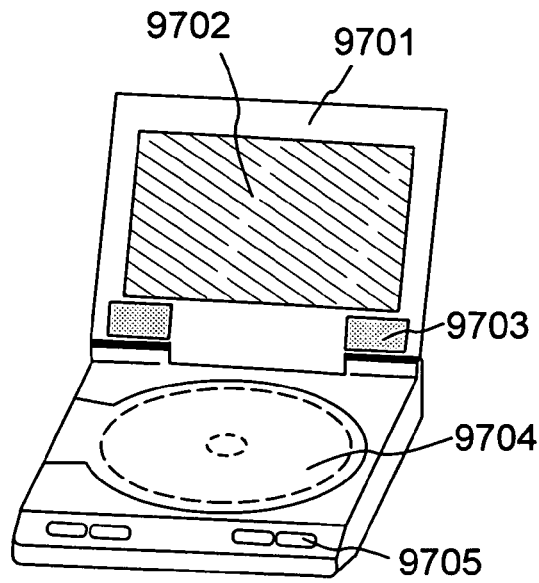
FIG. 17 shows an example of a semiconductor device.
Figure 17:
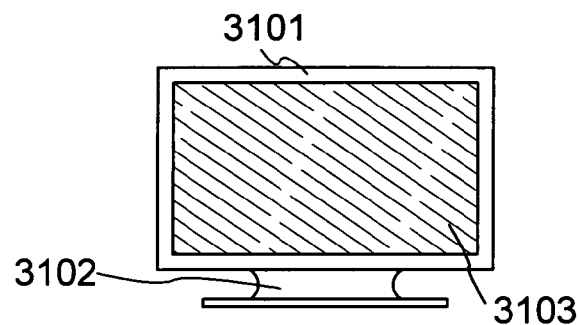
Figure 17:
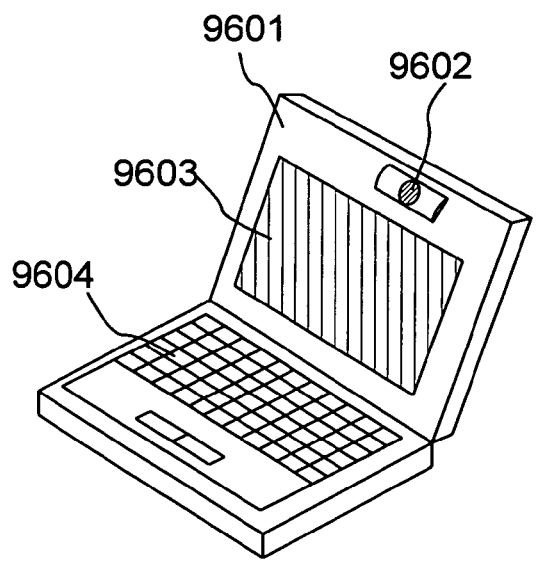
Figure 18:
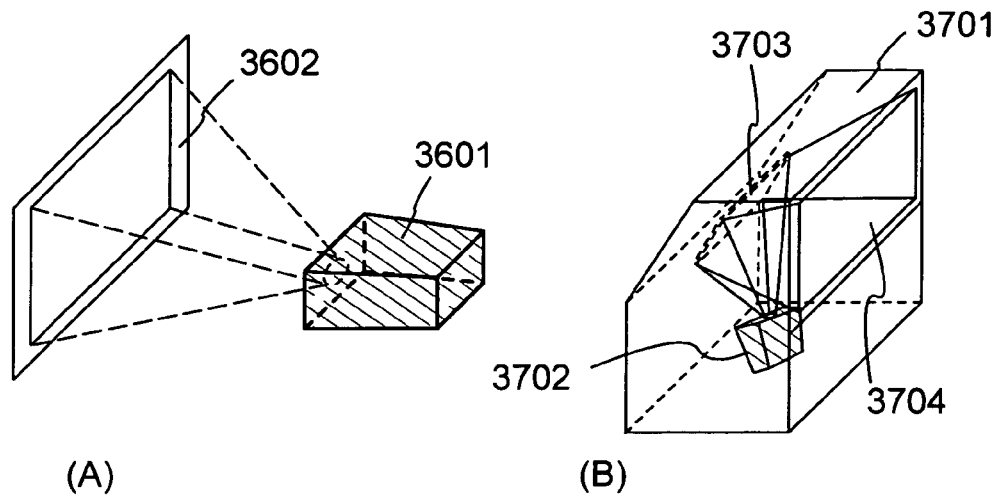
FIG. 18 shows an example of a semiconductor device.
Figure 18:
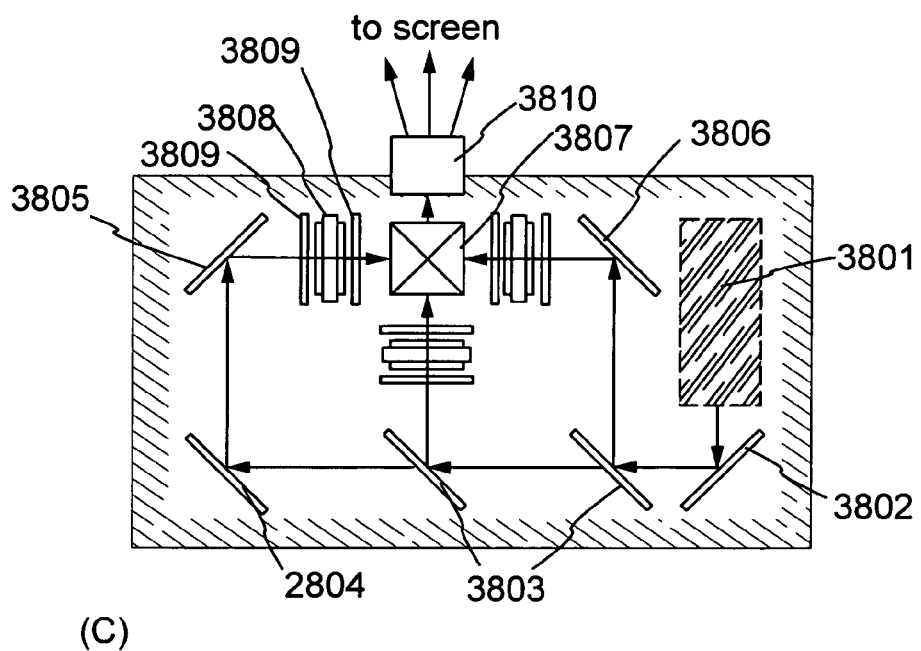
Figure 18:
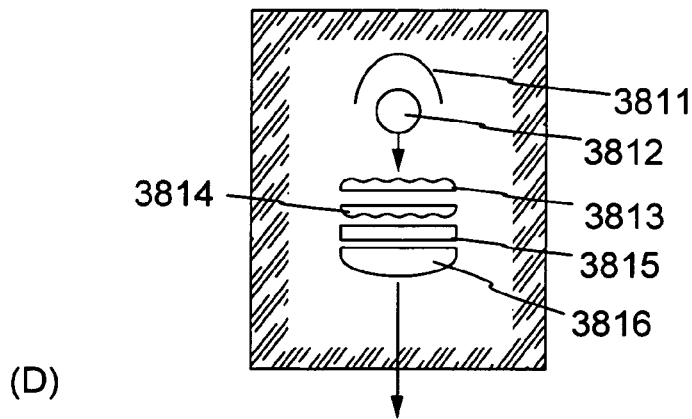

This embodiment explains with FIGS. 16, 17 and 18, a semiconductor device in which an active matrix type liquid crystal display device including a TFT circuit according to the present invention is slotted.

As the example of such a semiconductor device, a personal digital assistant (such as an electronic databook, a mobile computer, a cellular phone and the like), a video camera, a still camera, a personal computer, a television and the like are given. FIGS. 16 and 17 show these examples.

FIG. 16 (A) shows a cellular phone, including a main body 9001, a voice output portion 9002, a voice input portion 9003, a display device 9004, operating switches 9005, and an antenna 9006. The present invention can be applied to the voice output portion 9002, the voice input portion 9003, and the display device 9004 equipped with the active matrix substrate.

FIG. 16 (B) shows a video camera, including a main body 9101, a display device 9102, a voice input portion 9103, operating switches 9104, a battery 9105, and an image receiver 9106. The present invention can be applied to the voice input portion 9103, the display device 9102 equipped with the active matrix substrate, and the image receiver 9106.

FIG. 16 (C) shows a mobile computer or a personal digital assistant, including a main body 9201, a camera portion 9202, an image receiver 9203, an operating switch 9204, and a display device 9205. The present invention can be applied to the image receiver 9203 and the display device 9205 equipped with the active matrix substrate.

FIG. 16 (D) shows a goggle type display, including a main body 9301, a display device 9302, and an arm portion 9303. The present invention can be applied to the display device 9302. In addition, it can be applied to other signal controlling circuits though they are not shown.

FIG. 16 (E) shows a mobile book, including a main body 9501, display devices 9502 and 9503, a recording medium 9504, an operating switch 9505, and an antenna 9506. The mobile book is to display the data recorded in a minidisk (MD) and DVD or the data received with the antenna. The present invention can be applied to the display devices 9502 and 9503, which are direct view.

FIG. 17 (A) shows a player utilizing a recording medium that has a program recorded (hereinafter referred to as a recording medium) including a main body 9701, a display device 9702, a speaker portion 9703, a recording medium 9704, and an operating switch 9705. It is noted that this player makes it possible to enjoy listening to the music, watching the movies, playing the game, and playing on the Internet using a DVD (Digital Versatile Disc), CD or the like as its recording medium.

FIG. 17 (B) shows a television, including a main body 3101, a supporting stand 3102, and a display portion 3103.

FIG. 17 (C) shows a personal computer, including a main body 9601, an image input portion 9602, a display device 9603, and a keyboard 9604.

FIG. 18 (A) shows a front projector, including a projection device 3601, and a screen 3602. The present invention can be applied to a display device and other signal controlling circuits.

FIG. 18 (B) shows a rear projector, including a main body 3701, a projection device 3702, a mirror 3703, and a screen 3704. The present invention can be applied to a display device and other signal controlling circuits.

It is noted that FIG. 18 (C) is a drawing to show an example of the structure of the projection device 3601 in FIG. 18 (A) and the projection device 3702 in FIG. 18 (B). The projection devices 3601 and 3702 include an optical system of light source 3801, mirrors 3802, 3804 to 3806, a dichroic mirror 3803, a prism 3807, a liquid crystal display device 3808, a wave plate 3809, and a projection optical system 3810. The projection optical system 3810 has an optical system including a projection lens. This example showed the projection device of three-plate type, but there is no limitation on this, and the projection device of single-plate type is also acceptable. Moreover, the practitioner may arbitrarily arrange an optical system such as an optical lens, a film having a polarizing function, a film for adjusting phase contrast, an IR film or the like in the optical path shown by an arrow in FIG. 18 (C).

Moreover, FIG. 18 (D) shows an example of the structure of the optical system of light source 3801 in FIG. 18 (C) including a reflector 3811, a light source 3812, lens arrays 3813, 3814, a polarization changing element 3815, and a converging lens 3816. It is noted that the optical system of light source shown in FIG. 18 (D) is just one of the examples, and there is no particular limitation to that described above. For example, the practitioner may provide an optical system such as an optical lens, a film having a polarizing function, a film for adjusting phase contrast, an IR film or the like in the optical system of the source appropriately.

Furthermore, the present invention can be also applied to a display element of light-emitting type. As described above, the present invention can be applied to various kinds of devices, and can be applied to the electronics device in every field. It is noted that the electronics device in this embodiment can be freely combined with any of the embodiments 1 to 3.

When the laser irradiation apparatus of the present invention is employed, it is possible to perform the laser irradiation while keeping the energy of the laser light as constant as possible. As a result, it is expected that the repeatability of the laser irradiation process is enhanced and that the variation of the products through the laser irradiation process decreases considerably. The present invention is effective particularly to all the laser irradiation processes utilized in the process of the semiconductor device. Because the above processes allow only a narrow margin of the energy of the laser light, a little difference of the energy affects the characteristic to a large degree. Thus, the present invention is profitable industrially.

The invention claimed is:

1. A method for manufacturing a semiconductor apparatus comprising the steps of;
   forming a semiconductor film over a substrate;
   generating laser light;
   attenuating the laser light with an attenuator to produce attenuated laser light by introducing a part of the laser light thrown aside by the attenuator into a damper separated physically from the attenuator while cooling the damper;
   spraying an inert gas to the attenuator;
   making a surface of the semiconductor film match with a surface to be irradiated by setting the substrate with the semiconductor film formed thereon on a scanning stage; and
   irradiating the semiconductor film with the attenuated laser light by moving the scanning stage-while irradiating the laser light.

2. A method for manufacturing a semiconductor apparatus comprising the steps of;
   forming a semiconductor film over a substrate;
   generating laser light;
   attenuating the laser light with an attenuator to produce attenuated laser light by introducing a part of the laser light thrown aside by the attenuator into a damper separated physically from the attenuator while cooling the attenuator and the damper;
   spraying an inert gas to the attenuator;
   making a surface of the semiconductor film match with a surface to be irradiated by setting the substrate with the semiconductor film formed thereon on a scanning stage; and
   irradiating the semiconductor film with the attenuated laser light by moving the scanning stage while irradiating the laser light.

3. A method for manufacturing a semiconductor apparatus comprising the steps of;
   forming a semiconductor film over a substrate;
   generating laser light;
   attenuating the laser light with an attenuator to produce attenuated laser light by introducing a part of the laser light thrown aside by the attenuator into a damper separated physically from the attenuator while water-cooling the damper;
   spraying an inert gas to the attenuator;
   making a surface of the semiconductor film match with a surface to be irradiated by setting the substrate with the semiconductor film formed thereon on a scanning stage; and
   irradiating the semiconductor film with the attenuated laser light by moving the scanning stage while irradiating the laser light.

4. A method for manufacturing a semiconductor apparatus comprising the steps of;
   forming a semiconductor film over a substrate;
   generating laser light;
   attenuating the laser light with an attenuator to produce attenuated laser light by introducing the laser light thrown aside by the attenuator into a damper separated physically from the attenuator while water-cooling the attenuator and the damper;
   spraying an inert gas to the attenuator;
   making a surface of the semiconductor film match with a surface to be irradiated by setting the substrate with the semiconductor film formed thereon on a scanning stage; and
   irradiating the semiconductor film with the attenuated laser light by moving the scanning stage while irradiating the laser light.

5. A method for manufacturing a semiconductor apparatus comprising the steps of;
   forming a semiconductor film over a substrate;
   generating laser light;
   attenuating the laser light with an attenuator to produce attenuated laser light by introducing the laser light thrown aside by the attenuator into a damper separated physically from the attenuator while air-cooling the attenuator and water-cooling the damper;
   spraying an inert gas to the attenuator;

making a surface of the semiconductor film match with a surface to be irradiated by setting the substrate with the semiconductor film formed thereon on a scanning stage; and irradiating the semiconductor film with the attenuated laser light by moving the scanning stage while irradiating the laser light.

6. The method for manufacturing the semiconductor apparatus according to any one of claims 1 through 5, wherein the laser oscillator is one selected from the group consisting of an excimer laser, a YAG laser, and a glass laser.

7. The method for manufacturing the semiconductor apparatus according to any one of claims 1 through 5, wherein the laser oscillator is one selected from the group consisting of a $YVO_4$ laser, a YLF laser, and an Ar laser.

8. The method for manufacturing a semiconductor device according to claim 1, wherein the part of the laser light thrown aside by the attenuator is introduced into the damper while cooling the damper so as to keep attenuation ratio constant.

9. The method for manufacturing a semiconductor device according to claim 2, wherein the part of the laser light thrown aside by the attenuator is introduced into the damper while cooling the attenuator and the damper so as to keep attenuation ratio constant.

10. The method for manufacturing a semiconductor device according to claim 3, wherein the part of the laser light thrown aside by the attenuator is introduced into the damper while water-cooling the damper so as to keep attenuation ratio constant.

11. The method for manufacturing a semiconductor device according to claim 4, wherein the part of the laser light thrown aside by the attenuator is introduced into the damper while water-cooling the attenuator and the damper so as to keep attenuation ratio constant.

12. The method for manufacturing a semiconductor device according to claim 5, wherein the part of the laser light thrown aside by the attenuator is introduced into the damper while air-cooling the attenuator and water-cooling the damper so as to keep attenuation ratio constant.

13. The method for manufacturing a semiconductor device according to claim 1, further comprising the step of shaping the attenuated laser light into a linear shape, wherein the scanning stage is moved to a direction of a minor axis of the linear shape.

14. The method for manufacturing a semiconductor device according to claim 2, further comprising the step of shaping the attenuated laser light into a linear shape, wherein the scanning stage is moved to a direction of a minor axis of the linear shape.

15. The method for manufacturing a semiconductor device according to claim 3, further comprising the step of shaping the attenuated laser light into a linear shape, wherein the scanning stage is moved to a direction of a minor axis of the linear shape.

16. The method for manufacturing a semiconductor device according to claim 4, further comprising the step of shaping the attenuated laser light into a linear shape, wherein the scanning stage is moved to a direction of a minor axis of the linear shape.

17. The method for manufacturing a semiconductor device according to claim 5, further comprising the step of shaping the attenuated laser light into a linear shape, wherein the scanning stage is moved to a direction of a minor axis of the linear shape.

18. The method for manufacturing a semiconductor device according to claim 1, wherein the inert gas is nitrogen.

19. The method for manufacturing a semiconductor device according to claim 2, wherein the inert gas is nitrogen.

20. The method for manufacturing a semiconductor device according to claim 2, wherein the inert gas is nitrogen.

21. The method for manufacturing a semiconductor device according to claim 4, wherein the inert gas is nitrogen.

22. The method for manufacturing a semiconductor device according to claim 5, wherein the inert gas is nitrogen.

23. The method for manufacturing a semiconductor device according to claim 1, wherein a temperature sensor is provided with the attenuator.

24. The method for manufacturing a semiconductor device according to claim 2, wherein a temperature sensor is provided with the attenuator.

25. The method for manufacturing a semiconductor device according to claim 3, wherein a temperature sensor is provided with the attenuator.

26. The method for manufacturing a semiconductor device according to claim 4, wherein a temperature sensor is provided with the attenuator.

27. The method for manufacturing a semiconductor device according to claim 5, wherein a temperature sensor is provided with the attenuator.

28. The method for manufacturing a semiconductor device according to claim 1, wherein the step of attenuating the laser light with the attenuator comprises the steps of:

transmitting a part of the laser light and reflecting the part of laser light by an attenuation element; and compensating an optical path of the transmitted laser light by a computer.

29. The method for manufacturing a semiconductor device according to claim 2, wherein the step of attenuating the laser light with the attenuator comprises the steps of:

transmitting a part of the laser light and reflecting the part of laser light by an attenuation element; and compensating an optical path of the transmitted laser light by a computer.

30. The method for manufacturing a semiconductor device according to claim 3, wherein the step of attenuating the laser light with the attenuator comprises the steps of:

transmitting a part of the laser light and reflecting the part of laser light by an attenuation element; and compensating an optical path of the transmitted laser light by a computer.

31. The method for manufacturing a semiconductor device according to claim 4, wherein the step of attenuating the laser light with the attenuator comprises the steps of:

transmitting a part of the laser light and reflecting the part of laser light by an attenuation element; and compensating an optical path of the transmitted laser light by a computer.

32. The method for manufacturing a semiconductor device according to claim 5, wherein the step of attenuating the laser light with the attenuator comprises the steps of:

transmitting a part of the laser light and reflecting the part of laser light by an attenuation element; and compensating an optical path of the transmitted laser light by a computer.

* * * * *